(12) United States Patent
Park et al.

(10) Patent No.: US 11,343,600 B2
(45) Date of Patent: May 24, 2022

(54) FOLDABLE DISPLAY DEVICE AND SOUND PROVIDING METHOD THEREOF

(71) Applicant: Samsung Display Co., LTD., Yongin-si (KR)

(72) Inventors: Yong Han Park, Hwaseong-si (KR); Young Ran Son, Seoul (KR); Hyun Jung Kim, Seongnam-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 142 days.

(21) Appl. No.: 16/830,557

(22) Filed: Mar. 26, 2020

(65) Prior Publication Data

US 2020/0314513 A1 Oct. 1, 2020

(30) Foreign Application Priority Data

Mar. 26, 2019 (KR) .................. 10-2019-0034407

(51) Int. Cl.
| | |
|---|---|
| *H04R 7/06* | (2006.01) |
| *H04R 1/02* | (2006.01) |
| *H04R 17/00* | (2006.01) |
| *H04R 9/06* | (2006.01) |
| *H04R 7/04* | (2006.01) |
| *H04R 1/40* | (2006.01) |

(Continued)

(52) U.S. Cl.
CPC ......... *H04R 1/025* (2013.01); *H01L 27/3225* (2013.01); *H01L 27/3272* (2013.01); *H01L 51/5237* (2013.01); *H04R 1/2811* (2013.01); *H04R 1/403* (2013.01); *H04R 3/12* (2013.01); *H04R 7/04* (2013.01); *H04R 7/06* (2013.01); *H04R 7/10* (2013.01); *H04R 9/06* (2013.01); *H04R 17/00* (2013.01); *H04R 23/006* (2013.01); *H04R 31/006* (2013.01); *H01L 27/323* (2013.01); *H01L 51/5253* (2013.01); *H04R 1/28* (2013.01); *H04R 2201/003* (2013.01); *H04R 2499/11* (2013.01); *H04R 2499/15* (2013.01)

(58) Field of Classification Search
CPC ............ H04R 2499/11; H04R 2499/15; G06F 1/133512; G06F 1/1647
See application file for complete search history.

(56) References Cited

U.S. PATENT DOCUMENTS

| 9,332,660 B2 * | 5/2016 | Fujii | ...................... H05B 33/22 |
| 9,891,815 B2 * | 2/2018 | Mitsunaga | ............ G06F 1/1643 |

(Continued)

FOREIGN PATENT DOCUMENTS

| CN | 111163197 A * | 5/2020 |
| KR | 1020180027467 A | 3/2018 |

*Primary Examiner* — Ryan Robinson
(74) *Attorney, Agent, or Firm* — Cantor Colburn LLP

(57) ABSTRACT

A foldable display device includes: a first display panel including a first substrate and a first pixel array layer which is disposed on a first surface of the first substrate; a second display panel including a second substrate and a second pixel array layer which is disposed on a first surface of the second substrate; and a first sound generator disposed between a second surface of the first display panel opposite to the first surface of the first display panel and a second surface of the second display panel opposite to the first surface of the second display panel, where the first sound generator outputs first sound by vibrating at least one of the first and second display panels.

20 Claims, 30 Drawing Sheets

(51) Int. Cl.
    *H04R 3/12*     (2006.01)
    *H01L 51/52*     (2006.01)
    *H01L 27/32*     (2006.01)
    *H04R 31/00*     (2006.01)
    *H04R 1/28*     (2006.01)
    *H04R 23/00*     (2006.01)
    *H04R 7/10*     (2006.01)

(56) References Cited

U.S. PATENT DOCUMENTS

| | | | |
|---|---|---|---|
| 10,409,325 B2 * | 9/2019 | Choi | G02F 1/1333 |
| 10,452,106 B2 * | 10/2019 | Cho | G06F 1/1647 |
| 10,474,282 B2 * | 11/2019 | Park | G06F 1/1647 |
| 2021/0219035 A1 * | 7/2021 | Zu | H04R 9/06 |
| 2021/0273669 A1 * | 9/2021 | Chen | H04M 1/035 |

* cited by examiner

FOLDABLE DISPLAY DEVICE AND SOUND PROVIDING METHOD THEREOF

This application claims priority to Korean Patent Application No. 10-2019-0034407, filed on Mar. 26, 2019, and all the benefits accruing therefrom under 35 U.S.C. § 119, the content of which in its entirety is herein incorporated by reference.

BACKGROUND

1. Field

The disclosure relates to a foldable display device and a sound providing method thereof.

2. Description of the Related Art

As the information society has developed, the demand for display devices for displaying images has increased and diversified. Recently, display devices have been applied to a variety of electronic devices such as a smart phone, a tablet personal computer ("PC"), a digital camera, a notebook computer, a navigation device, a smart television ("TV"), or the like.

Recently, a flexible display device that has flexibility, thereby being foldable or bendable, may be applied to a small-size electronic device to improve portability. Since the flexible display device may be folded or unfolded by a user, portability may be improved by considerably reducing the volume of the flexible display device.

SUMMARY

A flexible display device may include a display panel for displaying images and a sound generator for providing sound. Since the flexible display device may be in folded and unfolded states, the location of the sound generator in the flexible display device may be limited. In such a flexible display device, optimum sound is desired to be provided depending on whether the flexible display device is being used in folded or unfolded state.

Embodiments of the disclosure provide a foldable display device with improved the quality of sound by vibrating display panels to output sound.

Embodiments of the disclosure provide also provide a sound providing method of a foldable display device to improve the quality of sound by vibrating display panels to output sound.

According to an embodiment of the disclosure, a foldable display device includes: a first display panel including a first substrate and a first pixel array layer which is disposed on a first surface of the first substrate; a second display panel including a second substrate and a second pixel array layer which is disposed on a first surface of the second substrate; and a first sound generator between a second surface of the first display panel opposite to the first surface of the first display panel and a second surface of the second display panel opposite to the first surface of the second display panel, where the first sound generator outputs first sound by vibrating at least one of the first and second display panels.

In an embodiment, the first sound generator may be attached to the second surfaces of the first display panel and the second surface of the second display panel.

In an embodiment, the foldable display device may further include: a first light-shielding member disposed between the first sound generator and the second surface of the first display panel; and a second light-shielding member disposed between the first sound generator and the second surface of the second display panel.

In an embodiment, the foldable display device may further include: a first reinforcing member disposed on a first side of the first sound generator and between the first sound generator and the second surface of the first display panel; and a second reinforcing member disposed on a second side of the first sound generator and between the first sound generator and the second surface of the second display panel.

In an embodiment, the second display panel may include a first area, a second area, and a folding area between the first and second areas, and the second pixel array layer in the first area and the second pixel array layer in the second area face each other.

In an embodiment, the first sound generator may be disposed in the first area of the second display panel.

In an embodiment, the foldable display device may further comprise: a first panel bottom member disposed between the second surfaces of the first and second display panels in the first area of the second display panel and not overlapping with the first sound generator when viewed in a plan view in a thickness direction of the first display panel.

In an embodiment, the first panel bottom member may include a first adhesive disposed on the second surface of the first display panel, a second adhesive disposed on the second surface of the second display panel, and a first heat-dissipating member disposed between the first and second adhesives.

In an embodiment, the first panel bottom member may further include a first buffer member disposed between the first adhesive and the first heat-dissipating member and a second buffer member disposed between the second adhesive and the first heat-dissipating member.

In an embodiment, the foldable display device may further include a second panel bottom member disposed on the second surface of the second display panel in the second area of the second display panel.

In an embodiment, a thickness of the first panel bottom member may be greater than a thickness of the second panel bottom member.

In an embodiment, the first and second panel bottom members are not disposed in the folding area.

In an embodiment, the second panel bottom member may include a third adhesive disposed on the second surface of the second display panel in the second area of the second display panel, a second heat-dissipating member disposed on the third adhesive, and a third buffer member disposed between the third adhesive and the second heat-dissipating member.

In an embodiment, the foldable display device may further include: a second sound generator disposed between the second surfaces of the first and second display panels in the first area of the second display panel, where the second sound generator may output second sound by vibrating at least one of the first and second display panels.

In an embodiment, the first sound generator may be attached to the second surface of the first display panel, and the second sound generator may be attached to the second surface of the second display panel.

In an embodiment, the first and second sound generators may not overlap with each other when viewed from a plan view in a thickness direction of the first display panel.

In an embodiment, the foldable display device may further include: a third sound generator disposed on the second surface of the second display panel in the second area of the second display panel, where the third sound generator may output third sound by vibrating the second display panel.

In an embodiment, the first sound generator may vibrate at least one of the first and second display panels by using a piezoelectric material which contracts or expands in accordance with voltages applied thereto.

In an embodiment, the second and third sound generators may vibrate at least one of the first and second display panels or only the second display panel by generating a magnetic force using a voice coil therein.

According to an embodiment of the disclosure, a sound providing method of a foldable display device includes: when a folding area of a second display panel of the foldable display device is folded, displaying a first image using pixels of a first pixel array layer of a first display panel of the foldable display device and outputting first sound by vibrating the first display panel with a first sound generator; and when the folding area of the second display panel is unfolded, displaying a second image using pixels of a second pixel array layer of the second display panel and outputting second sound by vibrating the second display panel with the first sound generator.

According to embodiments of the disclosure, first sound can be output by vibrating at least one of first and second display panels using a first sound generator, which is disposed between the first and second display panels, in both the folded and unfolded states of a foldable display device.

BRIEF DESCRIPTION OF THE DRAWINGS

The above and other features of the invention will become more apparent by describing in detail embodiments thereof with reference to the attached drawings, in which.

DETAILED DESCRIPTION

Figure 1:
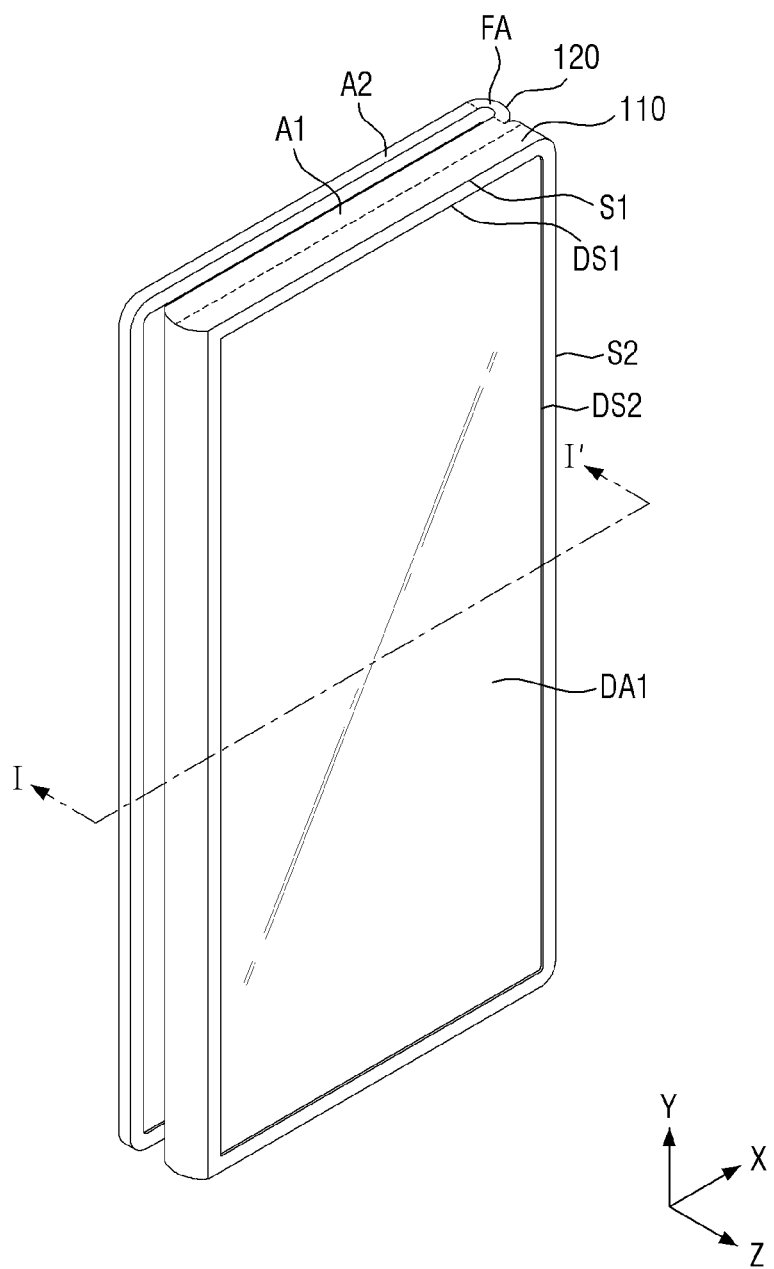
FIGS. 1 and 2 are perspective views illustrating a foldable display device according to an embodiment of the disclosure in its folded and unfolded states.

The invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. The same reference numbers indicate the same components throughout the specification. In the attached figures, the thickness of layers and regions is exaggerated for clarity.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

It will also be understood that when a layer is referred to as being "on" another layer or substrate, it can be directly on the other layer or substrate, or intervening layers may also be present. In contrast, when an element is referred to as being "directly on" another element, there are no intervening elements present.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." "At least one of A and B" means "A and/or B." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described with reference to the accompanying drawings.

Figure 2:
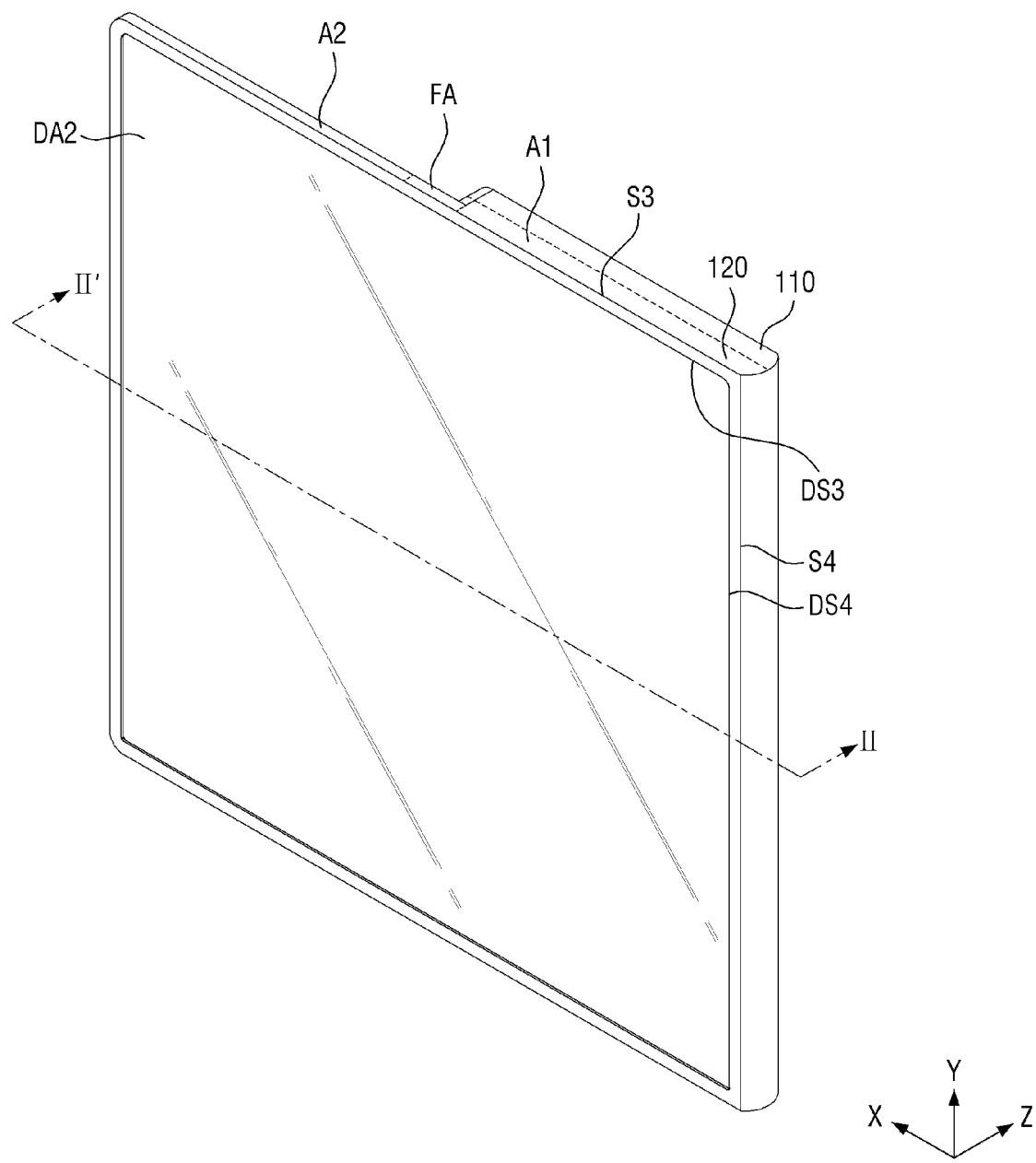

FIGS. 1 and 2 are perspective views illustrating a foldable display device according to an embodiment of the disclosure in folded and unfolded states, respectively.

Referring to FIGS. 1 and 2, an embodiment of a foldable display device 10 includes a first display panel 110 having a first display area DA1 and a second display panel 120 having a second display area DA2.

The terms "above", "top", and "top surface", as used herein, denote a direction in which the first display panel 110 is disposed with respect to the second display panel 120, i.e., a Z-axis direction, and the terms "below", "bottom", and "bottom surface", as used herein, denote a direction in which the second display panel 120 is disposed with respect to the first display panel 110, i.e., the direction opposite to the Z-axis direction. Also, the terms "left", "right", "upper", and "lower", as used herein, denote their respective directions as viewed from above the first display panel 110. For example, the term "left" denotes an X-axis direction, the term "right" denotes the direction opposite to the X-axis direction, the term "upper" denotes a Y-axis direction, and the term "lower" denotes the direction opposite to the Y-axis direction.

In an embodiment, the first display panel 110 may have a rectangular shape in a plan view. In one embodiment, for example, in a plan view, the first display panel 110 may have a rectangular shape having first sides 51 extending in a first direction (or the X-axis direction) and second sides S2 extending in a second direction (or the Y-axis direction). The first sides 51 may be shorter than the second sides S2. The corners where the first sides 51 and the second sides S2 meet may be rounded with a predetermined curvature or may be right-angled. The planar shape of the first display panel 110 is not particularly limited, and the first display panel 110 may be variously modified to be in one of other shapes such as a polygonal shape, a circular shape, or an elliptical shape, for example.

The first display panel 110 may include the first display area DA1 in which a plurality of pixels are disposed to display an image and a first non-display area in which the plurality of pixels are not disposed and which is disposed on the periphery of the first display area DA1.

In a plan view, the first display area DA1 of the first display panel 110 may have a rectangular shape having first display sides DS1 extending in the first direction (or the X-axis direction) and second display sides DS2 extending in the second direction (or the Y-axis direction). The first display sides DS1 may be shorter than the second display sides DS2. The corners where the first display sides DS1 and the second display sides DS2 meet may be rounded with a predetermined curvature or may be right-angled. The planar shape of the first display area DA1 is not particularly limited, and the first display area DA1 may be variously modified to be in one of other shapes such as a polygonal shape, a circular shape, or an elliptical shape, for example.

The second display panel 120 may include a folding area FA to be folded, as illustrated in FIG. 1, or unfolded, as illustrated in FIG. 2. When unfolded, the second display panel 120 may have a rectangular shape in a plan view. In one embodiment, for example, in a plan view, the second display panel 120 may have a rectangular shape having third sides S3 extending in the first direction (or the X-axis direction) and fourth sides S4 extending in the second direction (or the Y-axis direction). The third sides S3 may be shorter than the fourth sides S4, in which case, a user can view a screen that is longer in the second direction (or the Y-axis direction) than in the first direction (or the X-axis direction). Alternatively, the third sides S3 may be longer than the fourth sides S4, in which case, the user can view a screen that is longer in the first direction (or the X-axis direction) than in the second direction (or the Y-axis direction). Still alternatively, the third sides S3 may have substantially the same length as the fourth sides S4, in which case, the user can view a square screen. The corners where the third sides S3 and the fourth sides S4 meet may be rounded with a predetermined curvature or may be right-angled. The planar shape of the second display panel 120 is not particularly limited, and the second display panel 120 may be variously modified to be in one of other shapes such as a polygonal shape, a circular shape, or an elliptical shape, for example.

When unfolded, the second display area DA2 of the second display panel 120 may have a rectangular shape having third display sides DS3 extending in the first direction (or the X-axis direction) and fourth display sides DS4 extending in the second direction (or the Y-axis direction) in a plan view. The third display sides DS3 may be shorter than the fourth display sides DS4. Alternatively, the third display sides DS3 may be longer than the fourth display sides DS4. Still alternatively, the third display sides DS3 may have substantially the same length as the fourth display sides DS4. The corners where the third display sides DS3 and the fourth display sides DS4 meet may be rounded with a predetermined curvature or may be right-angled. The planar shape of the second display area DA2 is not particularly limited, and the second display area DA2 may be variously modified to be in one of other shapes such as a polygonal shape, a circular shape, or an elliptical shape, for example.

The second display panel 120 may include a first area A1, a second area A2, and the folding area FA between the first and second areas A1 and A2. A second substrate 121 of the second display panel 120 is a flexible substrate that is bendable, foldable, or rollable and can thus be easily folded in the folding area FA. In an embodiment, hinges may be disposed in the folding area FA on a second surface of the second substrate 121 to allow the second display panel 120 to be effectively folded in the folding area FA.

The second display panel 120 may be in-folded such that part of the second display area DA2 in the first area A1 and part of the second display area DA2 in the second area A2 face each other in a folded state. When the second display panel 120 is folded, the second display area DA2 may be curved in the folding area FA to have a predetermined curvature. When the second display panel 120 is unfolded, the second display area DA2 of the second display panel 120 may face the opposite direction of a third direction (or the opposite direction of the Z-axis direction), whereas the first display area DA1 of the first display panel 110 may face the third direction (or the Z-axis direction).

According to an embodiment, as shown in FIGS. 1 and 2, when the second display panel 120 is folded, a first image may be displayed in the third direction (or the Z-axis direction) using the first display panel 110. In such an embodiment, when the second display panel 120 is unfolded, a second image may be displayed in the opposite direction of the third direction (or the opposite direction of the Z-axis direction) through the second display panel 120. In such an embodiment, the first display panel 110 may display the first image in the third direction (or the Z-axis direction) or may not display any images.

Figure 3:
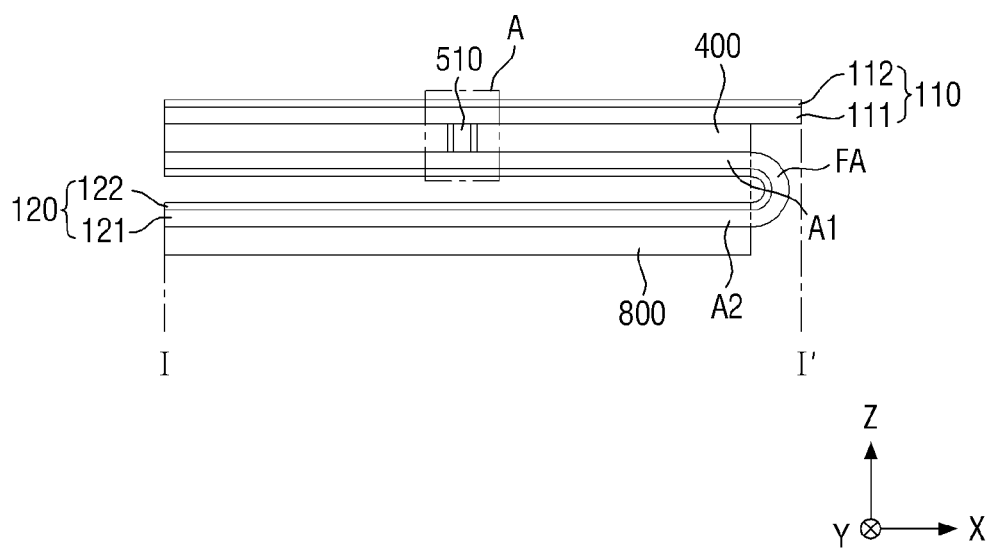
FIGS. 3 and 4 are cross-sectional views illustrating the foldable display device of FIGS. 1 and 2 in its folded and unfolded states.
Figure 4:
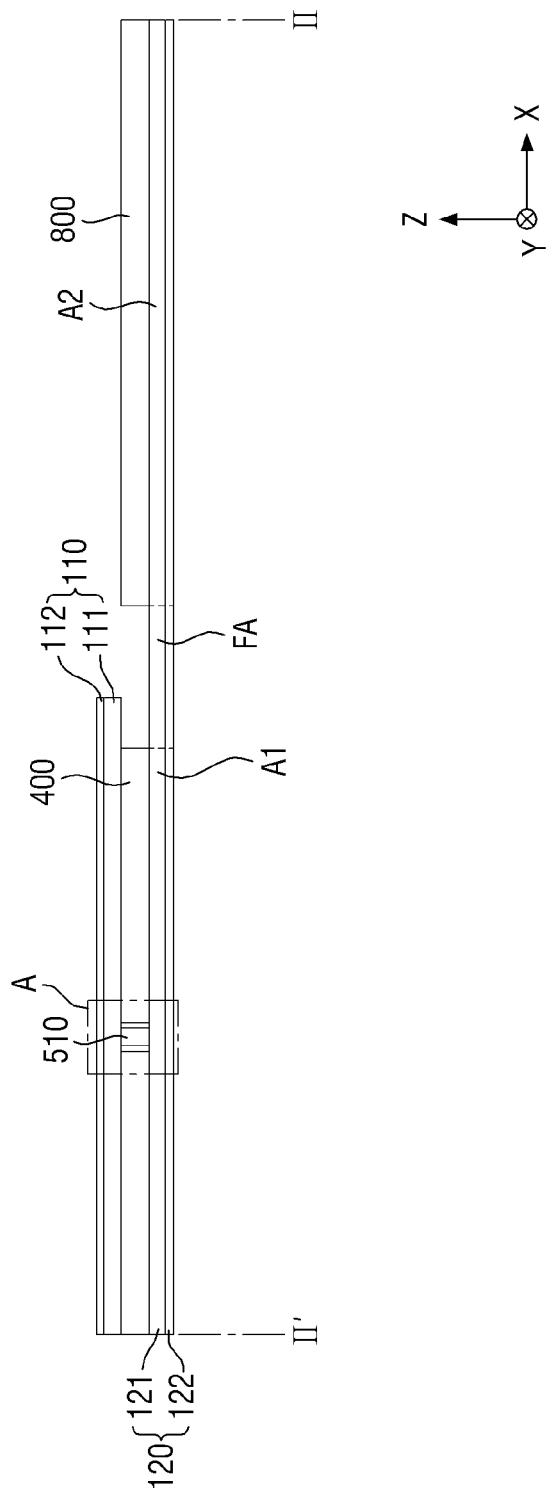
Figure 5:
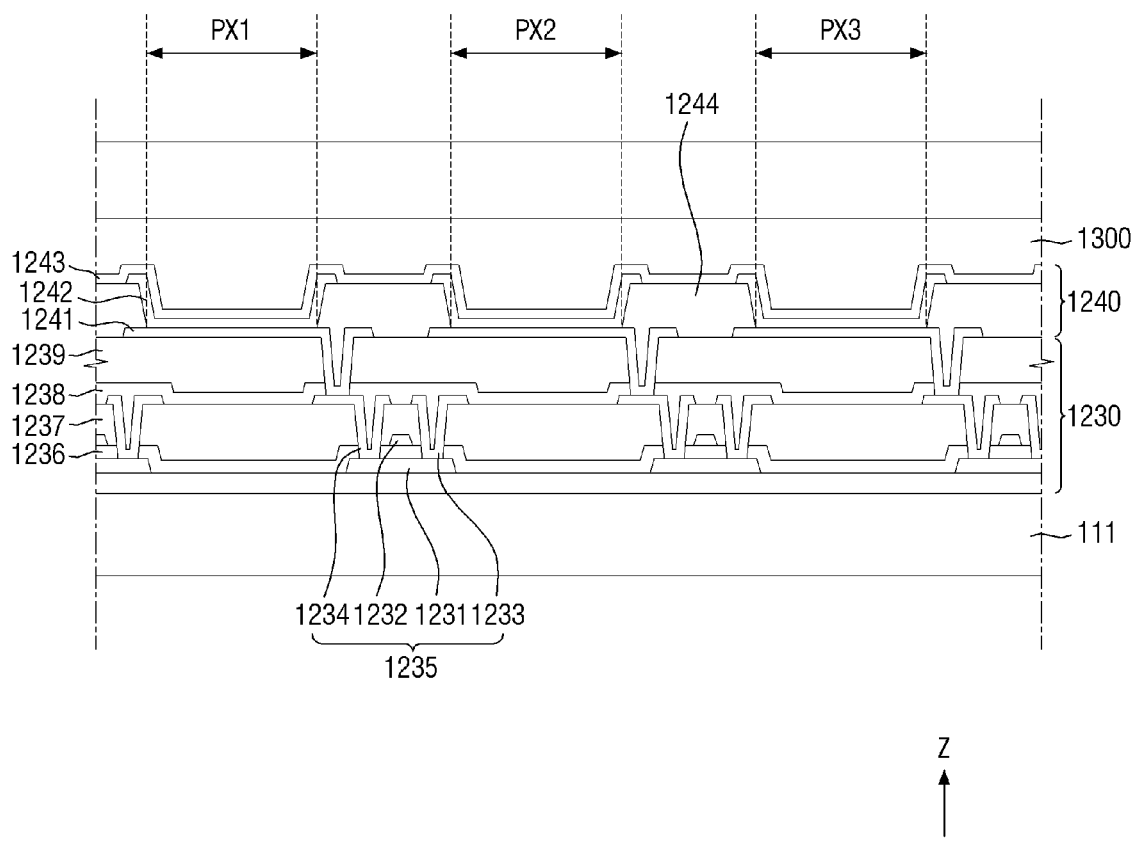
FIG. 5 is a cross-sectional view illustrating display areas of first and second display panels of FIGS. 3 and 4.
Figure 6:
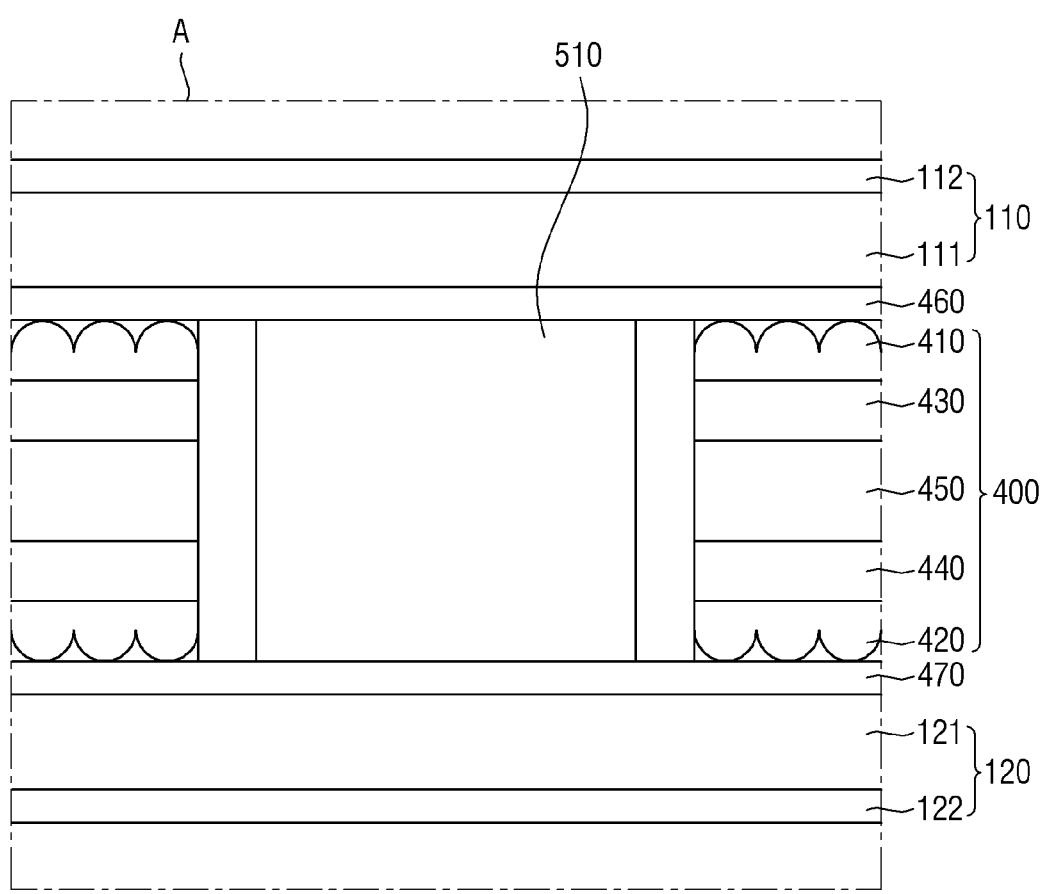
FIG. 6 is an enlarged cross-sectional view illustrating an area A of FIGS. 3 and 4.

FIGS. 3 and 4 are cross-sectional views illustrating the foldable display device of FIGS. 1 and 2 in folded and unfolded states. Specifically, FIG. 3 is a cross-sectional view taken along line I-I' of FIG. 1, and FIG. 4 is a cross-sectional view taken along line II-IF of FIG. 2. FIG. 5 is a cross-sectional view illustrating the display areas of the first and second display panels of FIGS. 3 and 4. FIG. 6 is an enlarged cross-sectional view illustrating an area A of FIGS. 3 and 4.

Referring to FIGS. 3 through 6, the foldable display device 10 may include the first display panel 110, the second display panel 120, a first panel bottom member 400, a second panel bottom member 800, and a first sound generator 510.

The first display panel 110 may include a first substrate 111 and a first pixel array layer 112. The first display panel 110 may be an organic light-emitting diode ("OLED") display panel using OLEDs, a micro-light-emitting diode ("mLED") display panel using mLEDs, or a quantum dot light-emitting diode ("QLED") display panel using QLEDs. Hereinafter, for convenience of description, embodiments where the first display panel 110 is an OLED display panel as illustrated in FIG. 5 will be described in detail.

The first substrate 111 may be a rigid substrate or a flexible substrate that is bendable, foldable, or rollable. In an embodiment, the first substrate 111 may include an insulating material such as a glass, quartz, a polymer resin, or the like. In such an embodiment, the polymer resin include plastic such as polyethersulphone ("PES"), polyacrylate ("PA"), polyarylate ("PAR"), polyetherimide ("PEI"), polyethylene naphthalate ("PEN"), polyethylene terephthalate ("PET"), polyphenylene sulfide ("PPS"), polyallylate, polyimide ("PI"), polycarbonate ("PC"), cellulose triacetate ("CAT"), cellulose acetate propionate ("CAP"), or a combination thereof, for example. Alternatively, the first substrate 111 may include a metallic material.

The first pixel array layer 112 is disposed on a first surface of the first substrate 111. In an embodiment, as illustrated in FIG. 5, the first pixel array layer 112 may include a thin-film transistor ("TFT") layer 1230, a light-emitting element layer 1240, and an encapsulation layer 1300.

The TFT layer 1230 is disposed on the first substrate 111. The TFT layer 1230 includes TFTs 1235, a gate insulating film 1236, an interlayer insulating film 1237, a passivation film 1238, and a planarization film 1239.

A buffer film may be disposed on the first substrate 111. The buffer film may be disposed on the first substrate 111 to protect the TFTs 1235 and light-emitting elements against moisture that may enter into the first substrate 111, which is susceptible to moisture. The buffer film may include a plurality of inorganic films that are alternately stacked on one another. In one embodiment, for example, the buffer film may be a multilayer film in which a silicon oxide (SiOx) film, a silicon nitride (SiNx) film, and/or a silicon oxynitride (SiON) film are alternately stacked. Alternatively, the buffer film may be omitted.

The TFTs 1235 are disposed on the buffer film. Each of the TFTs 1235 includes an active layer 1231, a gate electrode 1232, a source electrode 1233, and a drain electrode 1234. In an embodiment, as shown in FIG. 5, the TFTs 1235 may have a top gate structure in which the gate electrode 1232 is disposed above the active layer 1231, but the disclosure is not limited thereto. Alternatively, the TFTs 1235 may have a bottom gate structure in which the gate electrode 1232 is disposed below the active layer 1231 or a double gate structure in which the gate electrode 1232 is disposed both above and below the active layer 1231.

The active layer 1231 is disposed on the buffer film. The active layer 1231 may include or be formed of a silicon-based semiconductor material or an oxide-based semiconductor material. A light-shielding layer for blocking external light incident on the active layer 1231 may be disposed between the buffer film and the active layer 1231.

The gate insulating film 1236 may be disposed on the active layer 1231. The gate insulating film 316 may be an inorganic film such as, for example, a silicon oxide film, a silicon nitride film, or a multilayer film thereof.

The gate electrode 1232 and a gate line may be disposed on the gate insulating film 316. Each of the gate electrode 1232 and the gate line may be a single-layer film or a multilayer film including molybdenum (Mo), Al, chromium (Cr), gold (Au), titanium (Ti), Ni, neodymium (Nd), Cu, or an alloy thereof.

The interlayer insulating film 1237 may be disposed on the gate electrode 1232 and the gate line. The interlayer insulating film 1237 may be an inorganic film such as, for example, a silicon oxide film, a silicon nitride film, or a multilayer film thereof.

The source electrode 1233, the drain electrode 1234, and a data line may be disposed on the interlayer insulating film 1237. The source electrode 1233 and the drain electrode 1234 may be connected to the active layer 1231 through contact holes penetrating the gate insulating film 1236 and the interlayer insulating film 1237. Each of the source electrode 1233, the drain electrode 1234, and the data line may be a single-layer film or a multilayer film including Mo, Al, Cr, Au, Ti, Ni, Nd, Cu, or an alloy thereof.

The passivation film 1238 may be disposed on the source electrode 33, the drain electrode 1234, and the data line to insulate the TFTs 1235. The passivation film 1238 may be an inorganic film such as, for example, a silicon oxide film, a silicon nitride film, or a multilayer film thereof.

The planarization film 1239 may be disposed on the passivation film 1238 to planarize height differences formed by the TFTs 1235. The planarization film 1239 may be an organic film using an acrylic resin, an epoxy resin, a phenolic resin, a polyamide resin, or a polyimide resin.

The light-emitting element layer 1240 is disposed on the TFT layer 1230. The light-emitting element layer 1240 includes light-emitting elements and a pixel-defining film 1244.

The light-emitting elements and the pixel-defining film 1244 are disposed on the planarization film 1239. In an embodiment, the light-emitting elements may be OLEDs. In such an embodiment, each of the light-emitting elements may include an anode electrode 1241, a light-emitting layer 1242, and a cathode electrode 1243.

The anode electrode 1241 may be disposed on the planarization film 1239. The anode electrode 1241 may be connected to the source electrode 1233 through a contact hole penetrating the passivation film 1238 and the planarization film 1239.

The pixel-defining film 1244 may be disposed to cover the edges of the anode electrode 1241 to define a corresponding pixel. In an embodiment, the pixel-defining film 1244 may define the plurality of pixels. Each of the plurality of pixels may be a region in which the anode electrode 1241, the light-emitting layer 1242, and the cathode electrode 1243 are sequentially stacked on one another and holes from the anode electrode 1241 and electrons from the cathode electrode 1243 are combined in the light-emitting layer 1242 to emit light.

A light-emitting layer 1242 is disposed on the anode electrode 1241 and on the pixel-defining film 1244. The light-emitting layer 1242 may be an organic emission layer. The light-emitting layer 1242 may emit one of red light, green light, and blue light. Alternatively, the light-emitting layer 1242 may be a white light-emitting layer emitting white light. In such an embodiment, the light-emitting layer 1242 may have a structure in which red-, green-, and blue-light emitting layers are stacked on one another and may be a common layer formed for all the plurality of pixels, and the first and second display panels 110 and 120 may further include additional color filters for displaying red, green, and blue colors.

The light-emitting layer 1242 may include a hole transport layer, an emission layer, and an electron transport layer. The light-emitting layer 1242 may have a tandem structure with two or more stacks, where a charge generating layer may be disposed between the stacks.

The cathode electrode 1243 may be disposed on the light-emitting layer 1242. The cathode electrode 1243 may be disposed to cover the light-emitting layer 1242. The cathode electrode 1243 may be a common layer formed commonly for all the plurality of pixels.

In an embodiment where the light-emitting element layer 1240 is a top emission-type light-emitting element layer that emits light in an upper direction, the anode electrode 1241 may include or be formed of a metallic material with high reflectance such as a stack of Al and Ti (e.g., Ti/Al/Ti), a stack of Al and indium tin oxide ("ITO") (e.g., ITO/Al/ITO), a silver (Ag)-palladium (Pd)-copper (Cu) ("APC") alloy, or a stack of an APC alloy and ITO (e.g., ITO/APC/ITO), and the cathode electrode 1243 may include or be formed of a transparent conductive oxide ("TCO") material such as ITO or indium zinc oxide ("IZO") that can transmit light therethrough or a semi-transparent metallic material such as magnesium (Mg), Ag, or an alloy thereof. In an embodiment where the cathode electrode 1243 includes or is formed of a semi-transparent metallic material, the emission efficiency of the light-emitting element layer 1240 may be improved due to a micro-cavity effect.

In an embodiment where the light-emitting element layer 1240 is a bottom emission-type light-emitting element layer that emits light in a downward direction, the anode electrode 1241 may include or be formed of a TCO material such as ITO or IZO or a semi-transparent metallic material such as Mg, Ag, or an alloy thereof, and the cathode electrode 1243 may include or be formed of a metallic material with high reflectance such as a stack of Al and Ti (e.g., Ti/Al/Ti), a stack of Al and ITO (e.g., ITO/Al/ITO), an APC alloy, or a stack of an APC alloy and ITO (e.g., ITO/APC/ITO). In an embodiment where the anode electrode 1241 includes or is formed of a semi-transparent metallic material, the emission efficiency of the light-emitting element layer 1240 may be improved due to a micro-cavity effect.

The encapsulation layer 1300 is disposed on the light-emitting element layer 1240. In an embodiment, the encapsulation layer 1300 prevents oxygen or moisture from infiltrating into the light-emitting layer 1242 and the cathode electrode 1243. In such an embodiment, the encapsulation layer 1300 may include at least one inorganic film. The inorganic film may include or be formed of silicon nitride, aluminum nitride, zirconium nitride, titanium nitride, hafnium nitride, tantalum nitride, silicon oxide, aluminum oxide, or titanium oxide. The encapsulation layer 1300 may further include at least one organic film. The organic film may have a sufficient thickness to prevent foreign particles from entering the light-emitting layer 1242 and the cathode electrode 1243 through the encapsulation layer 1300. The organic film may include at least one of epoxy, acrylate, and urethane acrylate.

In an alternative embodiment, the second substrate 121 may be disposed to replace the encapsulation layer 1300. In such an embodiment, a filler member or a filler film may be disposed on the second substrate 121 and on the light-emitting element layer 1240.

A touch sensor layer may be disposed on the encapsulation layer 1300. Since the touch sensor layer may be disposed directly on the encapsulation layer 1300, the thickness of the foldable display device 10 may be reduced as compared to a case where a touch panel including the touch sensor layer is attached to the encapsulation layer 1300.

The touch sensor layer may include touch electrodes for sensing touch input from the user in a capacitive manner and touch lines connecting pads and the touch electrodes. In one embodiment, for example, the touch sensor layer may detect touch input from the user in a self-capacitance manner or a mutual capacitance manner.

The touch electrodes of the touch sensor layer may be disposed to overlap with the first display area DA1. The touch lines of the touch sensor layer may be disposed in the first non-display area.

The second display panel 120 may include the second substrate 121 and the second pixel array layer 122. The second display panel 120 may be an OLED display panel using OLEDs, an mLED display panel using mLEDs, or a QLED display panel using QLEDs. Hereinafter, for convenience of description, embodiments where the second display panel 120 is an OLED display panel as illustrated in FIG. 5 will be described in detail.

The second substrate 121 may be a rigid substrate or a flexible substrate that is bendable, foldable, or rollable. In an embodiment, the second substrate 121 may include an insulating material such as a glass, quartz, a polymer resin, or the like. In such an embodiment, the polymer resin include plastic such as PES, PA, PAR, PEI, PEN, PET, PPS, polyallylate, PI, PC, CAT, CAP, or a combination thereof. The second substrate 121 may include a metallic material.

The second pixel array layer 122 is disposed on a first surface of the second substrate 121. The second pixel array layer 122 is substantially the same as the first pixel array layer 112 of FIG. 5, and thus, any repetitive detailed description thereof will be omitted.

The first panel bottom member 400 may be disposed in the first area A1 of the second display panel 120. The first panel bottom member 400 may not be disposed in the folding area FA of the second display panel 120 to reduce folding stress.

The first panel bottom member 400 may be disposed between the second surface of the first substrate 111 and a second surface of the second substrate 121. The second surface of the first substrate 111 may be the opposite surface, in the third direction (or the Z-axis direction), of the first surface of the first substrate 111, and the second surface of the second substrate 121 may be the opposite surface, in the third direction (or the Z-axis direction), of the first surface of the second substrate 121.

A first surface of the first panel bottom member 400 may be attached to the second surface of the first substrate 111, and a second surface of the first panel bottom member 400 may be attached to the second surface of the second substrate 121. The second surface of the panel bottom member 400 may correspond to the opposite surface, in the third direction (or the Z-axis direction), of the first surface of the first panel bottom member 400.

The first panel bottom member 400 may include a first adhesive 410, a second adhesive 420, a first buffer member 430, a second buffer member 440, and a first heat-dissipating member 450.

The first adhesive 410 may be attached to the second surface of the first substrate 111. Alternatively, in a case where a first light-shielding member 460 is disposed on the second surface of the first substrate 111, as illustrated in FIG. 6, the first adhesive 410 may be attached to the first light-shielding member 460. In an embodiment where a first surface of the first adhesive 410 that faces the second surface of the first substrate 111 is embossed, as illustrated in FIG. 6, the first adhesive 410 may have a buffering effect.

The second adhesive 420 may be attached to the second surface of the second substrate 121. In an alternative embodiment where a second light-shielding member 470 is disposed on the second surface of the second substrate 121, as illustrated in FIG. 6, the second adhesive 420 may be attached to the second light-shielding member 470. In an embodiment where a first surface of the second adhesive 420 that faces the second surface of the second substrate 121 is embossed, as illustrated in FIG. 6, the second adhesive 420 may have a buffering effect.

The first buffer member 430 may be disposed on the second surface of the first adhesive 410. The first buffer member 430 may absorb external shock and may thus prevent damage to the first display panel 110. The second buffer member 440 may be disposed on the second surface of the second adhesive 420. The second buffer member 440 may absorb external shock and may thus prevent damage to the second display panel 120. Each of the first and second buffer members 430 and 440 may be as a single-layer film or a multilayer film. In one embodiment, for example, the first and second buffer members 430 and 440 may be formed of a polymer resin such as polyurethane ("PU"), PC, polypropylene ("PP"), or polyethylene ("PE") or may include an elastic material such as a foam sponge including or formed of rubber, a urethane-based material, or an acrylic material. The first and second buffer members 430 and 440 may be cushion layers.

The first heat-dissipating member 450 may be disposed between the first and second buffer members 430 and 440. The first heat-dissipating member 450 may include a first heat-dissipating layer which includes graphite or carbon nanotube and a second heat-dissipating layer which includes or is formed as a thin metal film including a metal with high thermal conductivity such as Cu, Ni, ferrite, or Ag.

The first and second light-shielding members 460 and 470 block the transmission of light and prevent a display circuit board, the first sound generator 510, a fingerprint recognition sensor, and the like from becoming visible in the first display area DA1 of the first display panel 110 or in the second display area DA2 of the second display panel 120. The first and second light-shielding members 460 and 470 may include a light-absorbing material such as a black pigment or dye.

The first sound generator 510 may be disposed between the second surfaces of the first and second substrates 111 and 121. The first sound generator 510 may be disposed in the first area A1 of the second display panel 120. The first panel bottom member 400 and the first sound generator 510 may not overlap with each other in the thickness direction of the first display panel 110 (or in the Z-axis direction).

In an embodiment, the first sound generator 510 may be attached to the second surfaces of the first and second substrates 111 and 121. In an alternative embodiment where the first and second light-shielding members 460 and 470 are disposed on the second surfaces of the first and second substrates 111 and 121, as illustrated in FIG. 6, the first sound generator 510 may be attached to the first light-shielding members 460 and 470. The length, in the second direction (or the Y-axis direction), of the first sound generator 510 may be substantially the same as the length, in the second direction (or the Y-axis direction), of the first panel bottom member 400.

Figure 9:
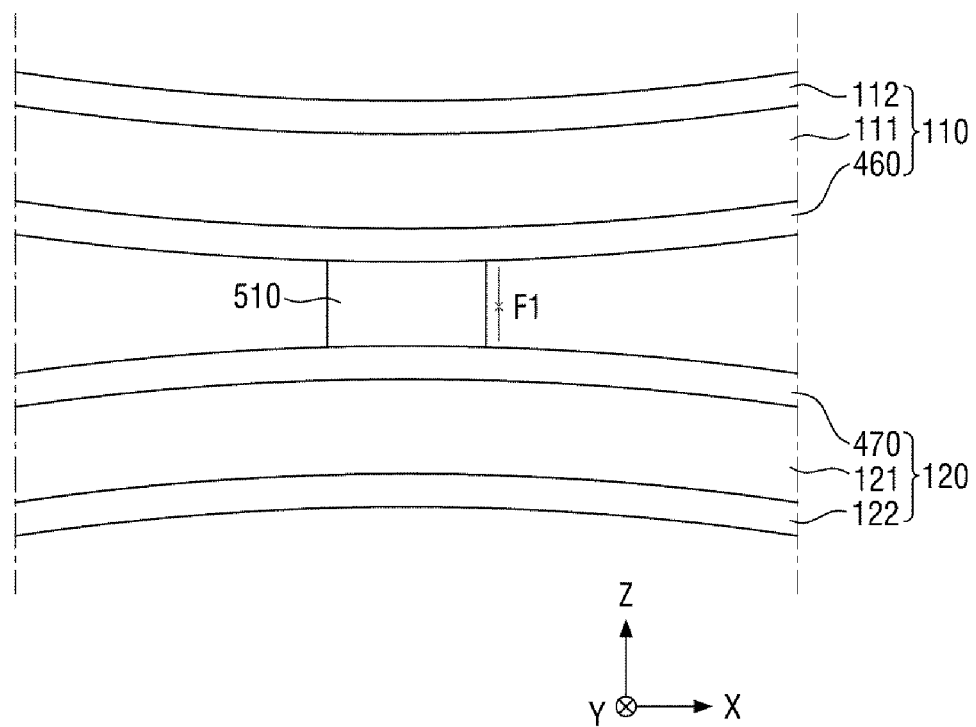
FIGS. 9 and 10 are cross-sectional views illustrating how the first and second display panels are vibrated by the first sound generator of FIG. 7.
Figure 10:
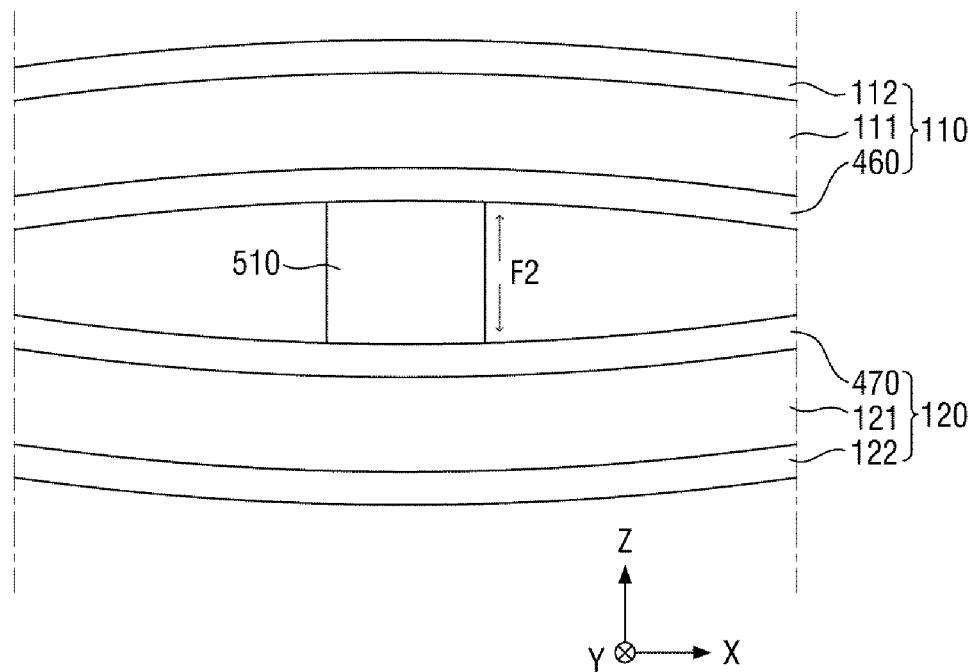
Figure 11:
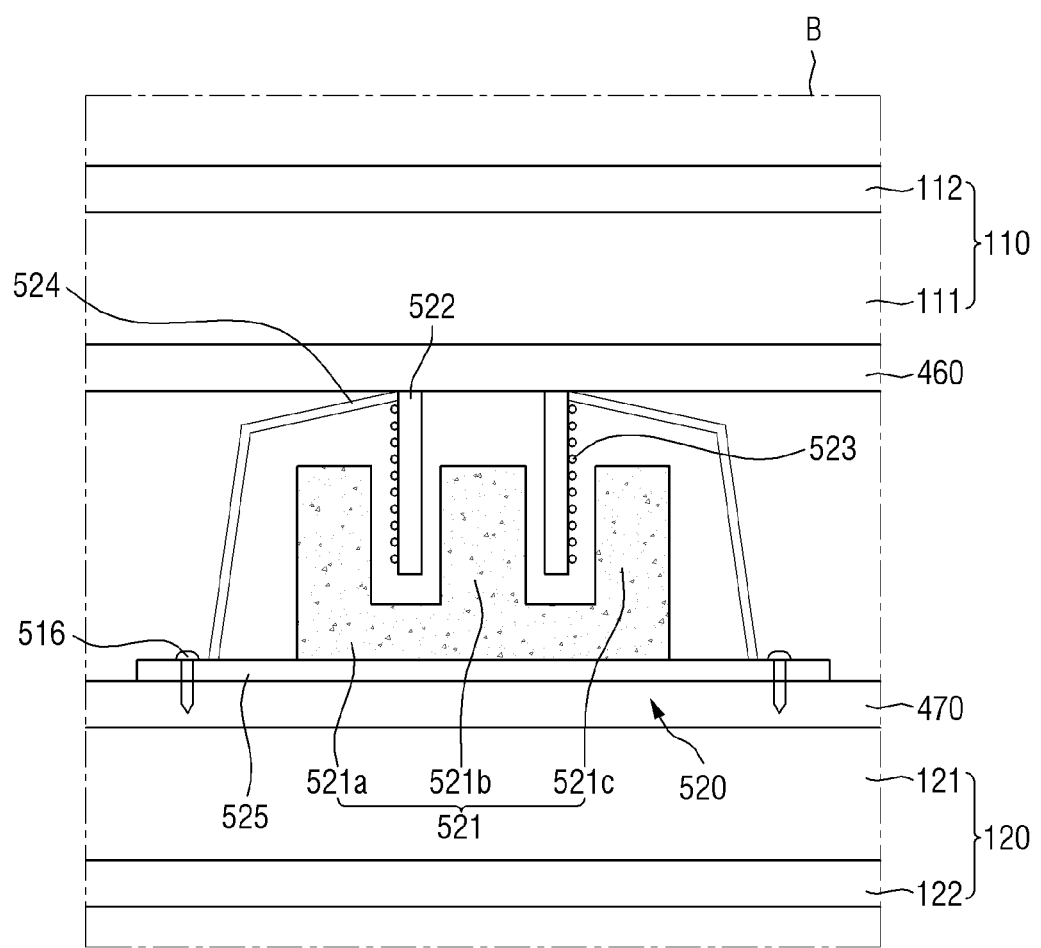
FIG. 11 is a cross-sectional view illustrating an alternative embodiment of the first sound generator of FIG. 6.
Figure 12:
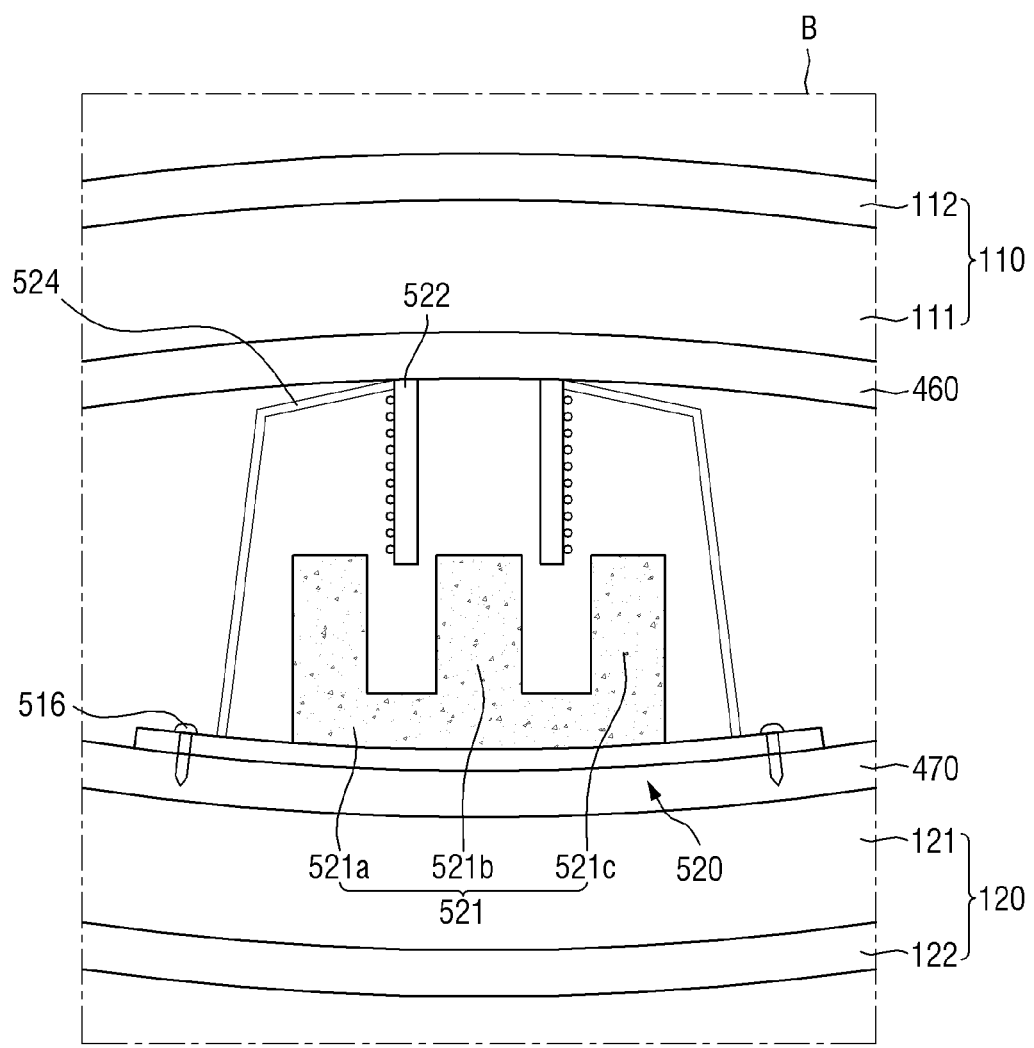
FIGS. 12 and 13 illustrate how the first and second display panels are vibrated by the first sound generator of FIG. 11.
Figure 13:
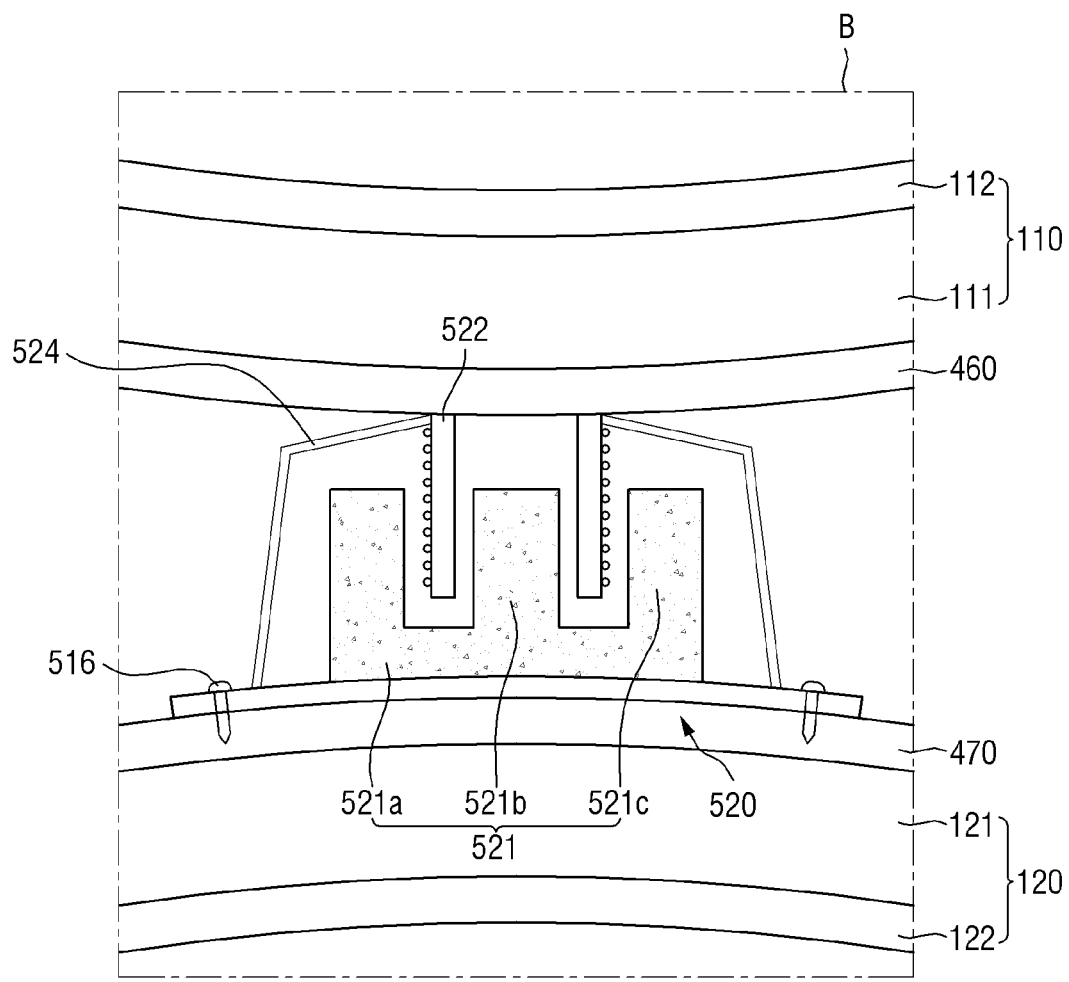
Figure 14:
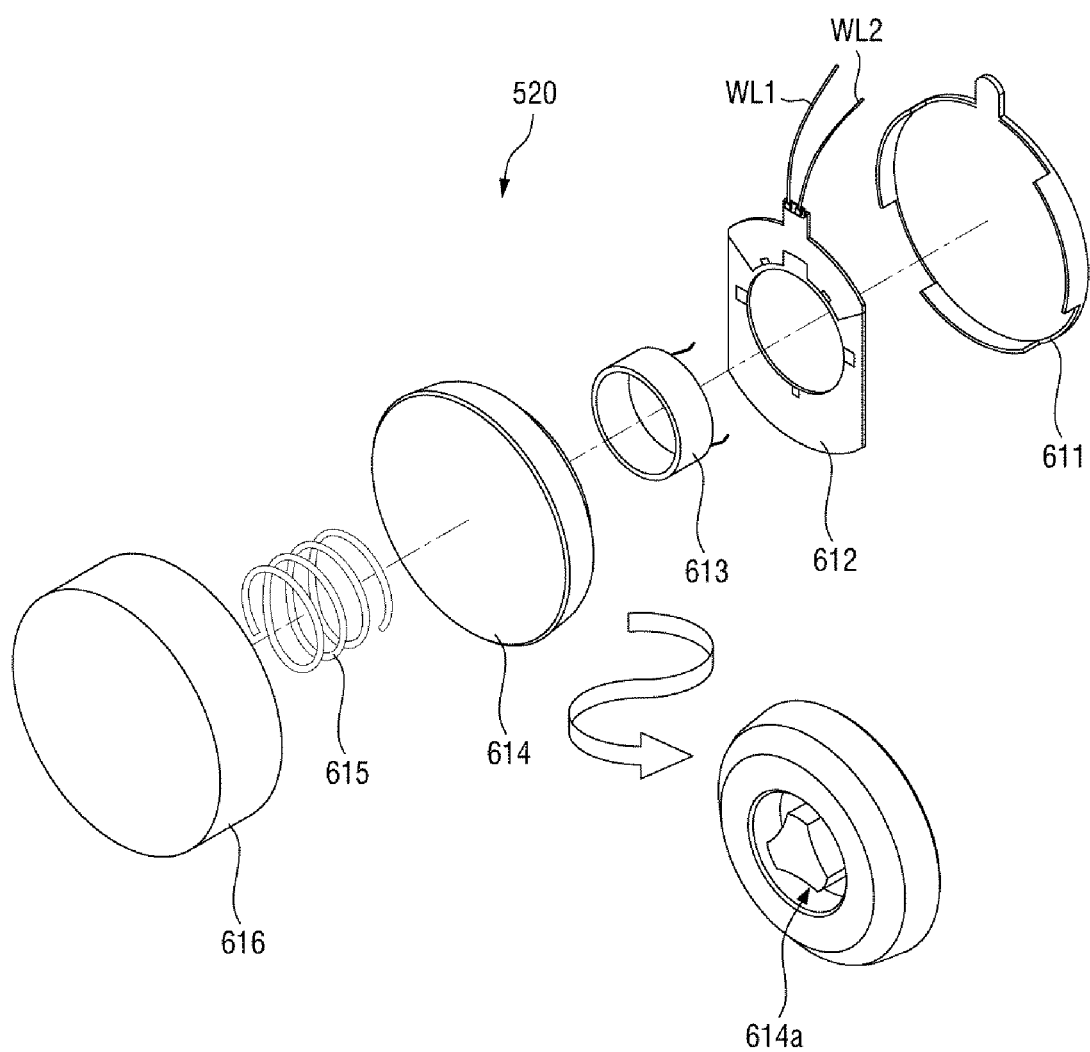
FIG. 14 is a cross-sectional view illustrating another alternative embodiment of the first sound generator of FIG. 6.

The first sound generator 510 may be a piezoelectric element or actuator including a piezoelectric material that contracts or expands in accordance with driving voltages applied thereto, as illustrated in FIGS. 7 through 10. Alternatively, the first sound generator 510 may be an exciter that generates a magnetic force, using a voice coil therein, in accordance with driving voltages applied thereto, as illustrated in FIGS. 11 through 13. Still alternatively, the first sound generator 510 may be a vibration motor that generates a magnetic force in a voice coil therein in accordance with driving voltages applied thereto, and the vibration motor may be, for example, a linear resonant actuator ("LRA") as illustrated in FIG. 14.

The first sound generator 510 may be attached to at least one of the first and second display panels 110 and 120 to vibrate the at least one of the first and second display panels 110 and 120 in accordance with driving voltages applied thereto. Accordingly, the first sound generator 510 may output first sound using the at least one of the first and second display panels 110 and 120 as a diaphragm. Therefore, the foldable display device 10 may output the first sound in both folded and unfolded states by vibrating the at least one of the first and second display panels 110 and 120 with the first sound generator 510.

A gap may be formed between the first panel bottom member 400 and the first sound generator 510. The gap formed between the first panel bottom member 400 and the first sound generator 510 may serve as a sound box when the first sound generator 510 outputs the first sound by vibrating the at least one of the first and second display panels 110 and 120.

In an embodiment, the first sound generator 510 may be disposed at the center of the first display panel 110 and at the center of the first area A1 of the second display panel 120, but the disclosure is not limited thereto.

The second panel bottom member 800 may be disposed in the second area A2 of the second display panel 120. The second panel bottom member 800 may not be disposed in the folding area FA of the second display panel 120 to reduce folding stress.

The second panel bottom member 800 may be disposed on the second surface of the second substrate 121. A first surface of the second panel bottom member 800 may be attached to the second surface of the second substrate 121. The second panel bottom member 800 may include a third adhesive, a third buffer member, and a second heat-dissipating member.

The third adhesive, the third buffer member, and the second heat-dissipating member of the second panel bottom member 800 may be substantially the same as the first panel bottom member 400 of FIG. 6, except that the first adhesive 410 and the first buffer member 430 are omitted. In such an embodiment, the second panel bottom member 800, unlike the first panel bottom member 400, does not include the first adhesive 410 and the first buffer member 430, the second panel bottom member 800 may be thinner than the first panel bottom member 400.

The third adhesive, the third buffer member, and the second heat-dissipating member of the second panel bottom member 800 are substantially the same as the second adhesive 420, the second buffer member 440, and the first heat-dissipating member 450, respectively, of the first panel bottom member 400 of FIG. 6, and thus, any repetitive detailed descriptions thereof will be omitted.

According to an embodiment, as shown in FIGS. 3 through 6, the first sound may be output by vibrating the first and second display panels 110 and 120 with the first sound generator 510, which is disposed between the first and second display panels 110 and 120. Therefore, the foldable display device may can output the first sound in both folded and unfolded states by vibrating at least one of the first and second display panels 110 and 120 with the first sound generator 510.

Figure 7:
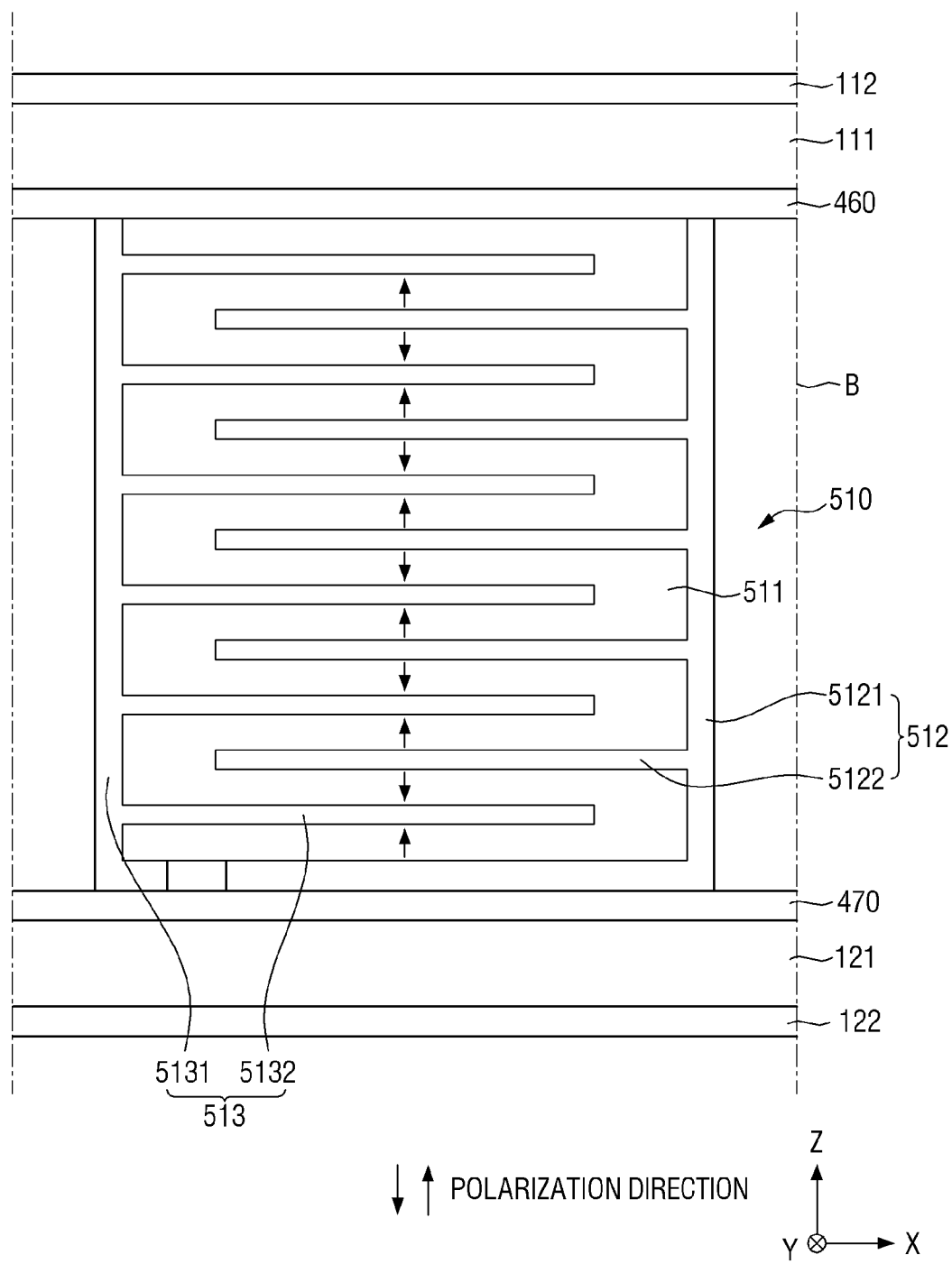
FIG. 7 is a cross-sectional view illustrating an embodiment of a first sound generator of FIG. 6.
Figure 8:
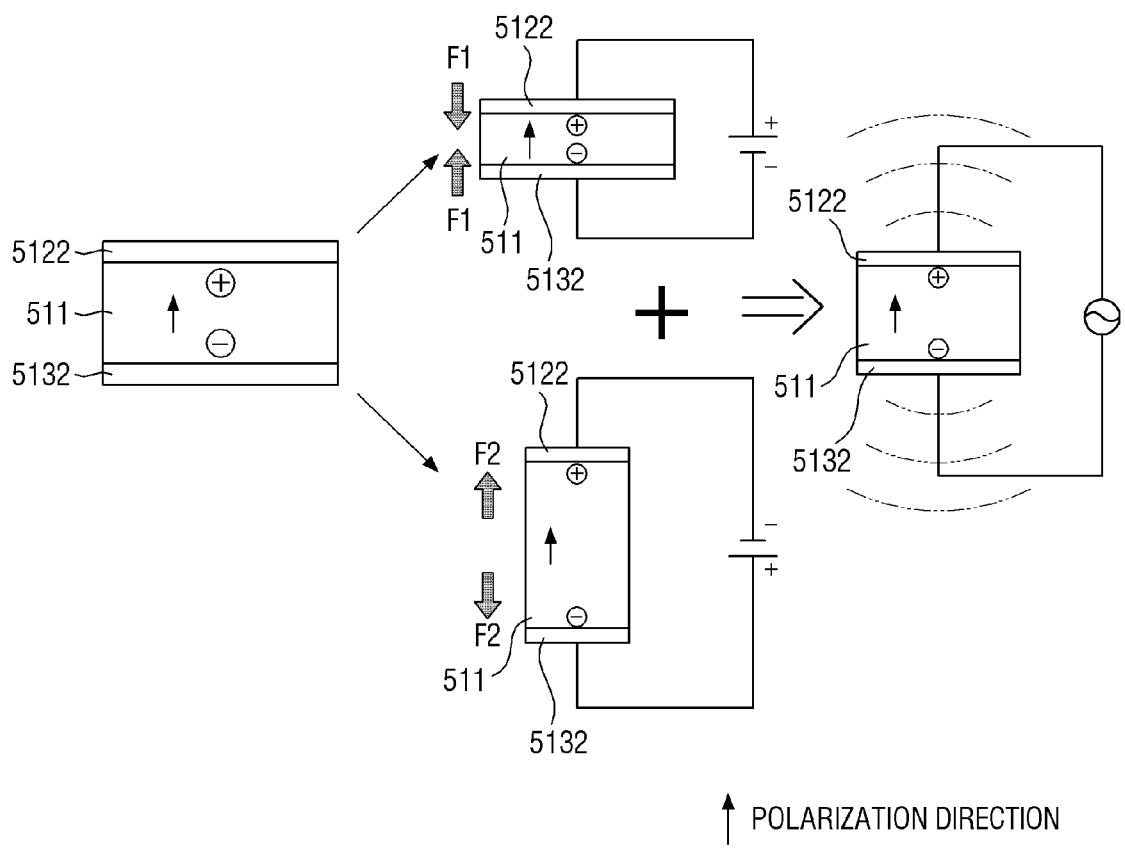
FIG. 8 illustrates how a vibration layer disposed between first branch electrodes and second branch electrodes of the first sound generator of FIG. 7 vibrates.

FIG. 7 is a cross-sectional view illustrating an embodiment of the first sound generator of FIG. 6. FIG. 8 illustrates how a vibration layer disposed between first branch electrodes and second branch electrodes of the first sound generator of FIG. 7 vibrates. FIGS. 9 and 10 are cross-sectional views illustrating how the first and second display panels are vibrated by the first sound generator of FIG. 7.

Referring to FIGS. 7 through 10, the first sound generator 510 may be a piezoelectric element or actuator capable of vibrating the first and second display panels 110 and 120 by including a piezoelectric material that contracts or expands in accordance with driving voltages applied thereto. The first sound generator 510 may include a vibration layer 511, a first electrode 512, and a second electrode 513.

In an embodiment, the first electrode 512 may include a first stem electrode 5121 and first branch electrodes 5122. The first stem electrode 5121 may be disposed on one side of the vibration layer 511 or may be disposed on more than one side of the vibration layer 511, as illustrated in FIG. 7. The first stem electrode 5121 may be disposed on the top surface of the vibration layer 511. The first branch electrodes 5122 may be branched off from the first stem electrode 5121. The first branch electrodes 5122 may be disposed in parallel to one another.

In an embodiment, the second electrode 513 may include a second stem electrode 5131 and second branch electrodes 5132. The second stem electrode 5131 may be disposed on another side of the vibration layer 511 or may be disposed on more than one side of the vibration layer 511, as illustrated in FIG. 7. Referring to FIG. 7, the first stem electrode 5121 may be disposed on one of the sides of the vibration layer 511 where the second stem electrode 5131 is not disposed. The second stem electrode 5131 may be disposed on the top surface of the vibration layer 511. The first and second stem electrodes 5121 and 5131 may not overlap with each other. The second branch electrodes 5132 may be branched off from the second stem electrode 5131. The second branch electrodes 5132 may be disposed in parallel to one another.

In an embodiment, the first branch electrodes 5122 and the second branch electrodes 5132 may be disposed in parallel to one another in a horizontal direction (or a X- or Y-axis direction). The first branch electrodes 5122 and the second branch electrodes 5132 may be alternately disposed in a vertical direction (or a Z-axis direction). In such an embodiment, the first branch electrodes 5122 and the second branch electrodes 5132 may be disposed repeatedly in the order of a first branch electrode 5122, a second branch electrode 5132, a first branch electrode 5122, and a second branch electrode 5132 along the vertical direction (or the Z-axis direction).

The vibration layer 511 may be a piezoelectric actuator that is deformed by first and second driving voltages applied to the first and second electrodes 512 and 513, respectively. In an embodiment, the vibration layer 511 may include at least one of a piezoelectric material, such as a polyvinylidene difluoride ("PVDF") film or lead zirconate titanate ("PZT"), and an electroactive polymer.

The vibration layer 511 may be disposed between the first branch electrodes 5122 and between the second branch electrodes 5132. In an embodiment, where the vibration layer 511 is fabricated at high temperature, the first and second electrodes 512 and 513 may be formed of a metal with a high melting point such as Ag or an alloy of Ag and Pd. In such an embodiment where the first and second electrodes 512 and 513 are formed of an alloy of Ag and Pd, the Ag content of the alloy of Ag and Pd may be greater than the Pd content of the alloy of Ag and Pd to raise the melting point of the first and second electrodes 512 and 513.

The first and second electrodes 512 and 513 may be connected to a sound circuit board and may receive driving voltages from the sound circuit board. The vibration layer 511 contracts or expands based on the difference between a first driving voltage applied to the first branch electrodes 5122 of the first electrode 512 and a second driving voltage applied to the second branch electrodes 5132 of the second electrode 513.

In an embodiment, as illustrated in FIG. 8, when the polarity of the vibration layer 511 between the first branch electrodes 5122 and their respective underlying second branch electrodes 5132 has an upward direction (↑), the vibration layer 511 may have a positive polarity in upper parts thereof adjacent to the first branch electrodes 5122 and a negative polarity in lower parts thereof adjacent to the second branch electrodes 5132. In such an embodiment, as illustrated in FIG. 8, when the polarity of the vibration layer 511 between the second branch electrodes 5132 and their respective underlying first branch electrodes 5122 has a downward direction (↓) the vibration layer 511 may have a negative polarity in the upper parts thereof adjacent to the first branch electrodes 5122 and a positive polarity in the lower parts thereof adjacent to the second branch electrodes 5132. The direction of the polarity of the vibration layer 511 may be determined by a poling process for applying an electric field to the vibration layer 511 using the first branch electrodes 5122 and the second branch electrodes 5132.

In a case where the direction of the polarity of the vibration layer 511 between the first branch electrodes 5122 and respective underlying second branch electrodes 5132 thereof may be the upward direction (↑) as illustrated in FIG. 8, the vibration layer 511 may contract in accordance with a first force F1 in response to a positive first driving voltage and a negative second driving voltage being applied to the first branch electrodes 5122 and the second branch electrodes 5132, respectively. The first force F1 may be a contraction force. In response to a negative first driving voltage and a positive second driving voltage being applied to the first branch electrodes 5122 and the second branch electrodes 5132, respectively, the vibration layer 511 may expand in accordance with a second force F2. The second force F2 may be an extension force.

In a case where the direction of the polarity of the vibration layer 511 between the second branch electrodes 5132 and their respective underlying first branch electrodes 5122 may be the downward direction (↓) the vibration layer 511 may expand in accordance with an extension force in response to a positive first driving voltage and a negative second driving voltage being applied to the second branch electrodes 5132 and the first branch electrodes 5122, respectively. In response to a negative first driving voltage and a positive second driving voltage being applied to the second branch electrodes 5132 and the first branch electrodes 5122, respectively, the vibration layer 511 may contract in accordance with a contraction force. The second force F2 may be a contraction force.

As illustrated in FIG. 8, in a case where the first and second driving voltages applied to the first and second electrodes 512 and 513, respectively, alternately change from a positive polarity to a negative polarity repeatedly, the vibration layer 511 repeatedly contracts and expands. As a result, the first sound generator 510 vibrates.

In an embodiment where the first sound generator 510 is attached to the second surfaces of the first and second substrates 111 and 121, the first and second display panels 110 and 120 may vibrate vertically due to stress, as illustrated in FIGS. 9 and 10, in response to the vibration layer 511 of the first sound generator 510 that contracts and expands. When the first and second display panels 110 and 120 are vibrated by the first sound generator 510, the foldable display device 10 may output the first sound.

FIG. 11 is a cross-sectional view illustrating an alternative embodiment of the first sound generator of FIG. 6. FIGS. 12 and 13 illustrate how the first and second display panels are vibrated by the first sound generator of FIG. 11.

Referring to FIGS. 11 through 13, an embodiment of the first sound generator 510 may be an exciter that generates a magnetic force using a voice coil therein and thereby vibrates in accordance with driving voltages applied thereto.

The first sound generator 510 may include a magnet 521, a bobbin 522, a voice coil 523, dampers 524, and a lower plate 525.

The magnet 521 may be a permanent magnet, e.g., a sintered magnet such as a barium ferrite magnet. In an embodiment, the magnet 521 may be a ferric trioxide ($Fe_2O_3$) magnet, a barium carbonate ($BaCO_3$) magnet, a neodymium magnet, a strontium ferrite magnet with an improved magnetic component, or an Al, nickel (Ni), or cobalt (Co) cast alloy magnet, but the disclosure is not limited thereto. In such an embodiment, the neodymium magnet may be, for example, a neodymium-iron-boron (Nd—Fe—B) magnet.

The magnet 521 may be attached and fixed to the lower plate 525 via an adhesive. The magnet 521 may include a plate 521a, a central protruding part 521b protruding from the center of the plate 521a, and a sidewall part 521c protruding from an edge of the plate. The central protruding part 521b and the sidewall part 521c may be spaced apart from each other at a predetermined distance, such that a predetermined space may be defined or formed between the central protruding part 521b and the sidewall part 521c. In an embodiment, the magnet 521 may have a cylindrical shape. In such an embodiment, the magnet 521 may be in the shape of a cylinder with a circular space formed at one of the bases thereof.

The central protruding part 521b of the magnet 521 may have N-pole magnetism, and the plate 521a and the sidewall part 521c may have S-pole magnetism. As a result, an external magnetic field may be generated between the central protruding part 521b and the plate 521a of the magnet 521 and between the central protruding part 521b and the sidewall part 521c of the magnet 521.

The bobbin 522 may in a cylindrical shape. In an embodiment, the central protruding part 521b of the magnet 521 may be disposed in the bobbin 522. In such an embodiment, the bobbin 522 may be disposed to surround the central protruding part 521b of the magnet 521. In an embodiment, the sidewall part 521c of the magnet 521 may be disposed on the outside of the bobbin 522. In such an embodiment, the sidewall part 521c of the magnet 521 may be disposed to surround the bobbin 522. Spaces may be formed between the bobbin 522 and the central protruding part 521b of the magnet 521 and between the bobbin 522 and the sidewall part 521c of the magnet 521.

The bobbin 522 may include or be formed of a pulp- or paper-processed material, Al, Mg, an alloy thereof or a synthetic resin such as polypropylene, or polyamide-based fibers. One end of the bobbin 522 may be attached to the second surface of the first substrate 111 via an adhesive. In an alternative embodiment where the first light-shielding member 460 is disposed on the second surface of the first substrate 111, as illustrated in FIG. 6, one end of the bobbin 522 may be attached and fixed to the first light-shielding member 360 via an adhesive. In such an embodiment, the adhesive may be a double-sided tape.

The voice coil 523 may be wound around the outer circumferential surface of the bobbin 522. One end of the voice coil 523 adjacent to one end of the bobbin 522 may receive the first driving voltage, and the other end of the voice coil 523 adjacent to the other end of the bobbin 522 may receive the second driving voltage. As a result, a current may flow in the voice coil 523 in accordance with first and second driving voltages. A magnetic field may be generated around the voice coil 523 based on the current that flows in the voice coil 523. In such an embodiment, the direction of the current that flows in the voice coil 523 when the first driving voltage is a positive voltage and the second driving voltage is a negative voltage may be opposite to the direction of the current that flows in the voice coil 523 when the first driving voltage is a negative voltage and the second driving voltage is a positive voltage. As the first and second driving voltages are alternately driven, the N pole and the S pole of the applied magnetic field may be changed so that an attracting force and a repulsive force can be alternately acted upon the magnet 521 and the voice coil 523. Accordingly, the bobbin 522, which has the voice coil 523 wound therearound, may reciprocate in the third direction (or the Z-axis direction).

The dampers 524 are disposed between the bobbin 522 and the lower plate 525. In an embodiment, the dampers 524 may contract or expand in accordance with the vertical movement of the bobbin 522 and may thus control the vertical vibration of the bobbin 522. In such an embodiment, since the dampers 524 are connected to the bobbin 522 and the lower plate 525, the vertical movement of the bobbin 522 may be limited by the restoring force of the dampers 524. In such an embodiment, when the bobbin 522 vibrates above or below a predetermined height, the bobbin 522 may return to its original position due to the restoring force of the dampers 524.

The lower plate 525 may be disposed on the bottom surface of the magnet 521. The lower plate 525 may be integrally formed as a single unitary body with the magnet 521 or may be a separate element from the magnet 521. In an embodiment where the lower plate 525 is a separate element from the magnet 521, the magnet 521 may be attached to the lower plate 525 via an adhesive such as a double-sided tape.

The lower plate 525 may be fixed to the second surface of the second substrate 121 via a fixing member 516 such as a screw. In an alternative embodiment, where the second light-shielding member 470 is disposed on the second surface of the second substrate 121, as illustrated in FIG. 6, the lower plate 525 may be fixed to the second light-shielding member 470 via the fixing member 516 such as a screw.

According to an embodiment, as shown in FIGS. 11 through 13, the magnet 521 is fixed not only to the lower plate 525, but also to the second substrate 121, and the bobbin 522 is fixed to the first substrate 111, such that the magnet 521 may reciprocate in the third direction (or the Z-axis direction), as illustrated in FIGS. 12 and 13. In such an embodiment, the first and second display panels 110 and 120 may be vibrated by the first sound generator 510, such that the foldable display device 10 may output the first sound.

FIG. 14 is a cross-sectional view illustrating another alternative embodiment of the first sound generator of FIG. 6. Specifically, FIG. 14 illustrates one embodiment where the first sound generator 510 is an LRA.

Referring to FIG. 14, an embodiment of the first sound generator 510 may include a lower chassis 611, a flexible printed circuit board ("FPCB") 620, a voice coil 613, a magnet 614, a spring 615, and an upper chassis 616. The lower and upper chassis 610 and 660 may include or be formed of a metallic material. The FPCB 612 may be disposed on a surface of the lower chassis 611 that faces the upper chassis 616 and may be connected to first and second sound wires WL1 and WL2. The voice coil 613 may be connected to a surface of the FPCB 612 that faces the upper chassis 616. Accordingly, one end of the voice coil 613 may be electrically connected to the first sound wire WL1, and the other end of the voice coil 613 may be electrically connected to the second sound wire WL2. The magnet 614 may be a permanent magnet, and a voice coil groove 614a, in which the voice coil 613 is received, may be defined or formed on a surface of the magnet 614 that faces the voice coil 613. A spring 615 may be disposed between the magnet 614 and the upper chassis 616.

The direction of a current that flows in the voice coil 613 of the first sound generator 510 may be controlled in accordance with first and second driving voltages applied to the first and second sound wires WL1 and WL2. A magnetic field may be generated around the voice coil 613 based on the current that flows in the voice coil 613. In such an embodiment, the direction of the current that flows in the voice coil 613 when the first driving voltage is a positive voltage and the second driving voltage is a negative voltage may be opposite to the direction of the current that flows in the voice coil 613 when the first driving voltage is a negative voltage and the second driving voltage is a positive voltage. As the first and second driving voltages are alternately driven, an attracting force and a repulsive force may be acted upon the magnet 614 and the voice coil 613 so that the magnet 614 may reciprocate between the voice coil 613 and the upper chassis 616 due to the spring 615. Then, the first display panel 110, which is disposed on the upper chassis 616, may vibrate, and as a result, the first sound may be output.

In such an embodiment where the first sound generator 510 is an LRA, as illustrated in FIG. 14, the first sound generator 510 may be attached only to the second surface of the first substrate 111, and a gap may be provided between the first sound generator 510 and the second surface of the second substrate 121. In such an embodiment, the first sound generator 510 may output the first sound by vibrating the first display panel 110 without vibrating the second display panel 120.

Figure 15:
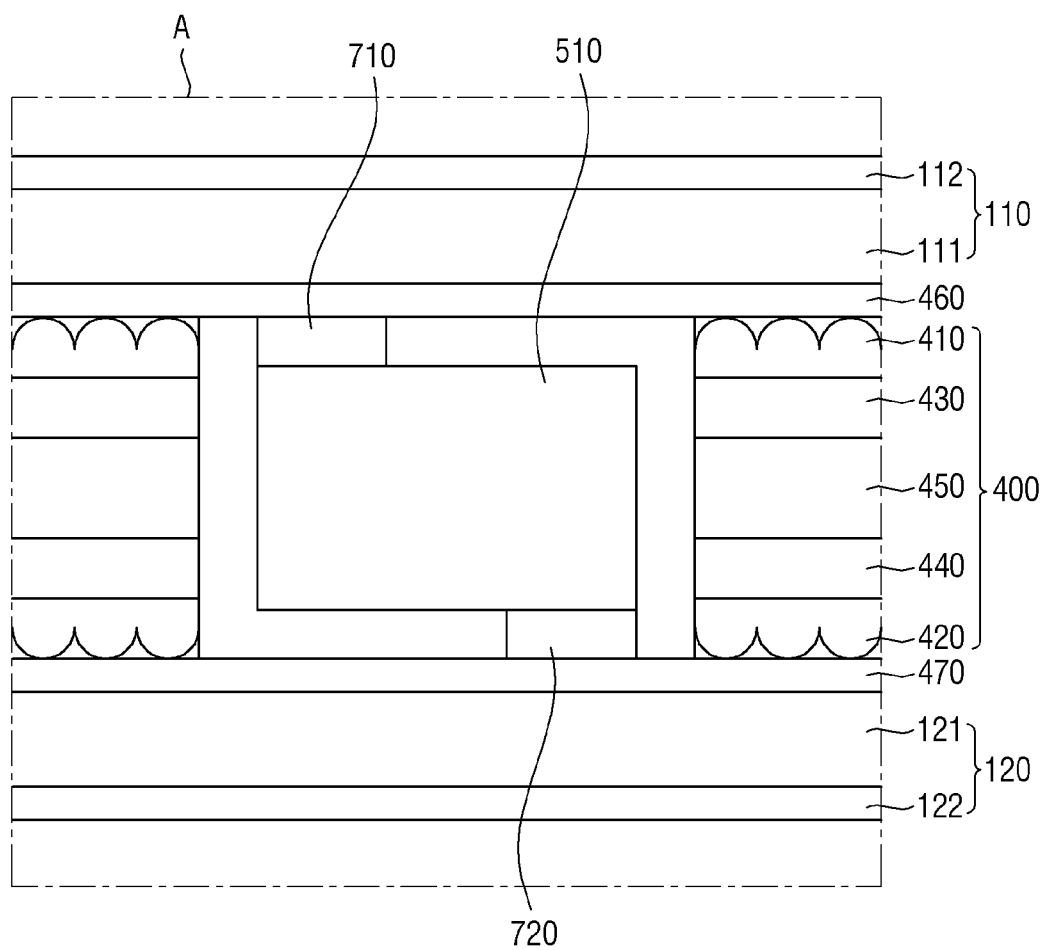
FIG. 15 is an enlarged cross-sectional view illustrating an alternative embodiment of the area A of FIGS. 3 and 4.

FIG. 15 is an enlarged cross-sectional view illustrating an alternative embodiment of the area A of FIGS. 3 and 4.

The embodiment of FIG. 15 is substantially the same as the embodiment of FIG. 6 except that a first reinforcing member 710 is disposed between the first sound generator 510 and the second surface of the first substrate 111, and that a second reinforcing member 720 is disposed between the first sound generator 510 and the second surface of the second substrate 121. The same or like elements shown in FIG. 15 have been labeled with the same reference characters as used above to describe the embodiment of FIG. 6, and any repetitive detailed description thereof will hereinafter be omitted or simplified.

Referring to FIG. 15, the first reinforcing member 710 may be disposed between the first sound generator 510 and the second surface of the first substrate 111. The first reinforcing member 710 may be disposed on a first side of a first surface of the first sound generator 510. In one embodiment, for example, the first reinforcing member 710 may be disposed on the left side of the top surface of the first sound generator 510.

The length, in the first direction (or the X-axis direction), of the first reinforcing member 710 may be smaller than the length, in the first direction (or the X-axis direction), of the first sound generator 510. The length, in the second direction (or the Y-axis direction), of the first reinforcing member 710 may be smaller than the length, in the second direction (or the Y-axis direction), of the first sound generator 510. The length, in the third direction (or the Z-axis direction), of the first reinforcing member 710 may be smaller than the length, in the third direction (or the Z-axis direction), of the first sound generator 510.

The second reinforcing member 720 may be disposed between the first sound generator 510 and the second surface of the second substrate 121. The second reinforcing member 720 may be disposed on a second side of a second surface of the first sound generator 510. In one embodiment, for example, the second reinforcing member 720 may be disposed on the right side of the bottom surface of the first sound generator 510.

The length, in the first direction (or the X-axis direction), of the second reinforcing member 720 may be smaller than the length, in the first direction (or the X-axis direction), of the first sound generator 510. The length, in the second direction (or the Y-axis direction), of the second reinforcing member 720 may be smaller than the length, in the second direction (or the Y-axis direction), of the first sound generator 510. The length, in the third direction (or the Z-axis direction), of the second reinforcing member 720 may be smaller than the length, in the third direction (or the Z-axis direction), of the first sound generator 510.

The lengths, in the second direction (or the Y-axis direction), of the first sound generator 510, the first reinforcing member 710, and the second reinforcing member 720 may be substantially the same as the length, in the second direction (or the Y-axis direction), of the first bottom member 400. The length, in the second direction (or the Y-axis direction), of the first reinforcing member 710 may be different from the length, in the second direction (or the Y-axis direction), of the second reinforcing member 720.

The first and second reinforcing members 710 and 720 may include a metallic material with a predetermined weight. Alternatively, the first and second reinforcing members 710 and 720 may include an elastic material.

Due to the presence of the first reinforcing member 710, a space in which the first sound generator 510 may vibrate may be provided between the first surface of the first sound generator 510 and the second surface of the first sound generator 510. In such an embodiment, due to the presence of the second reinforcing member 720, a space in which the first sound generator 510 may vibrate may be provided between the second surface of the first sound generator 510 and the second surface of the second substrate 121. Accordingly, in such an embodiment, the intensity of vibration of the first sound generator 510 may be enhanced, and low-frequency sound may be output by the first sound generator 510.

Figure 16:
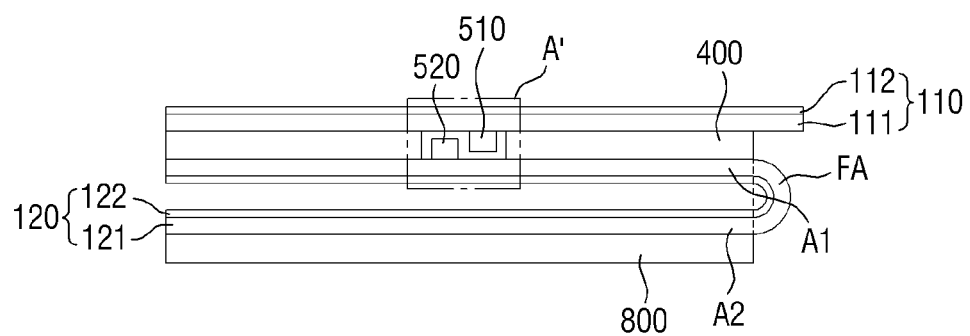
FIGS. 16 and 17 are cross-sectional views illustrating the foldable display device of FIGS. 1 and 2 in folded and unfolded states.
Figure 17:
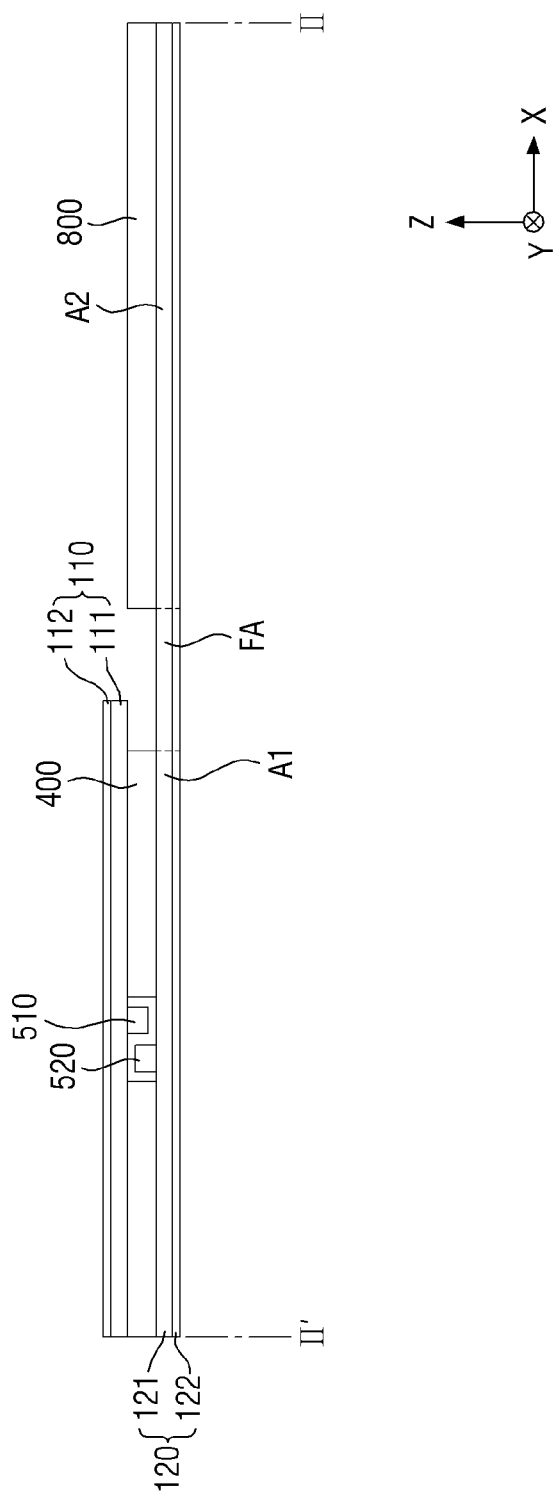
Figure 18:
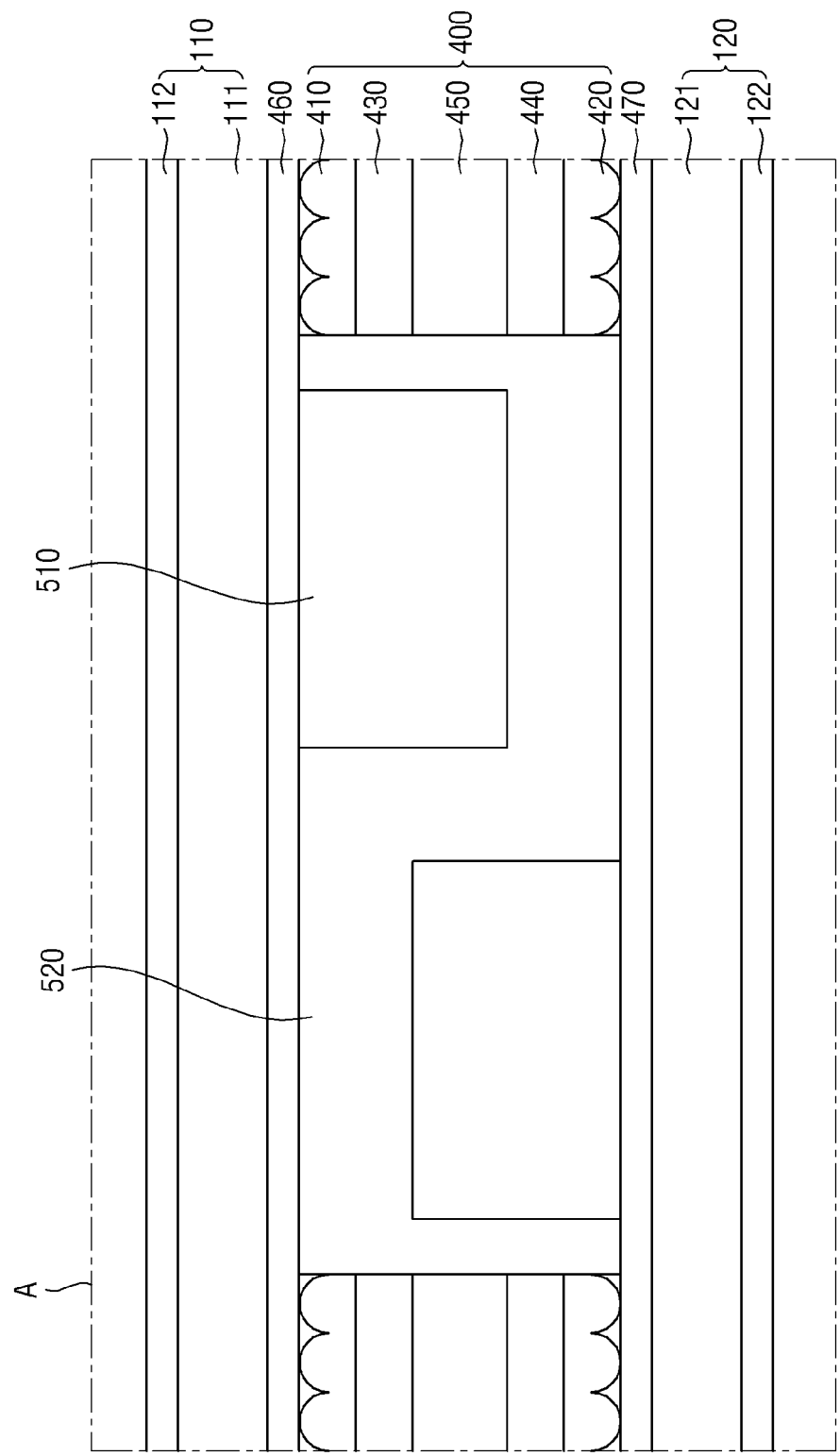
FIG. 18 is an enlarged cross-sectional view illustrating another alternative embodiment of an area A of FIGS. 3 and 4.

FIGS. 16 and 17 are cross-sectional views illustrating the foldable display device of FIGS. 1 and 2 in folded and unfolded states. Specifically, FIG. 16 is a cross-sectional view taken along line I-I' of FIG. 1, and FIG. 17 is a cross-sectional view taken along line II-IF of FIG. 2. FIG. 18 is an enlarged cross-sectional view illustrating another alternative embodiment of an area A' of FIG. 16.

The embodiment of FIGS. 16 through 18 is substantially the same as the embodiment of FIGS. 3, 4, and 6 except that the first sound generator 510 is attached to the second surface of the first substrate 111, and that a second sound generator 520 is attached to the second surface of the second substrate 121. The same or like elements shown in FIG. 16 through FIG. 18 have been labeled with the same reference characters as used above to describe the embodiment of FIGS. 3, 4 and 6, and any repetitive detailed description thereof will hereinafter be omitted or simplified.

Referring to FIGS. 16 through 18, in an embodiment, the first and second sound generators 510 and 520 may be disposed between the second surfaces of the first and second substrates 111 and 121. The first and second sound generators 510 and 520 may be disposed in the first area A1 of the second display panel 120. The first panel bottom member 400 and the first sound generator 510 may not overlap with each other in the thickness direction of the first display panel 110 (or in the Z-axis direction). The first panel bottom member 400 and the second sound generator 520 may not overlap with each other in the thickness direction of the first display panel 110 (or in the Z-axis direction). The first and second sound generators 510 and 520 may not overlap with each other in the thickness direction of the first display panel 110 (or in the Z-axis direction).

In an embodiment, the first sound generator 510 may be attached to the second surface of the first substrate 111, and the second sound generator 520 may be attached to the second surface of the second substrate 121. In an alternative embodiment where the first light-shielding member 460 is disposed on the second surface of the first substrate 111 and the second light-shielding member 470 is disposed on the second surface of the second substrate 121, as illustrated in FIG. 18, the first sound generator 510 may be attached to the first light-shielding member 460, and the second sound generator 520 may be attached to the second light-shielding member 470. The length, in the second direction (or the Y-axis direction), of the first sound generator 510 may be smaller than the length, in the second direction (or the Y-axis direction), of the first panel bottom member 400. The length, in the second direction (or the Y-axis direction), of the second sound generator 520 may be smaller than the length, in the second direction (or the Y-axis direction), of the first panel bottom member 400.

The first sound generator 510 may be a piezoelectric element or actuator including a piezoelectric material that contracts or expands in accordance with driving voltages applied thereto, as illustrated in FIGS. 7 through 10. In such an embodiment, the first sound generator 510 may not be attached to the second surface of the second substrate 121. In an embodiment, where the second light-shielding member 470 is disposed on the second surface of the second substrate 121, the first sound generator 510 may not be attached to the second light-shielding member 470. There may exist a gap between the first sound generator 510 and the second surface of the second substrate 121 or the second light-shielding member 470.

In such an embodiment, since the first sound generator 510 is attached to the first display panel 110, the first sound generator 510 may vibrate the first display panel 110 by contracting or expanding in accordance with driving voltages applied thereto. Accordingly, the first sound generator 510 may output the first sound by using the first display panel 110 as a diaphragm.

The second sound generator 520 may be a piezoelectric element or actuator including a piezoelectric material that contracts or expands in accordance with driving voltages applied thereto, as illustrated in FIGS. 7 through 10. In such an embodiment, the second sound generator 520 may not be attached to the second surface of the first substrate 111. In an embodiment where the first light-shielding member 460 is disposed on the second surface of the first substrate 111, the second sound generator 520 may not be attached to the first light-shielding member 460. There may exist a gap between the second sound generator 520 and the second surface of the first substrate 111 or the first light-shielding member 460.

In such an embodiment, since the second sound generator 520 is attached to the second display panel 120, the second sound generator 520 may vibrate the second display panel 120 by contracting or expanding in accordance with driving voltages applied thereto. Accordingly, the second sound generator 520 may output second sound by using the second display panel 120 as a diaphragm.

When folded, the foldable display device 10 may display the first image on the first display panel 110 and may output the first sound by vibrating the first display panel 110 with the first sound generator 510. When unfolded, the foldable display device 10 may display the second image on the second display panel 120 and may output the second sound by vibrating the second display panel 120 with the second sound generator 520.

Gaps may be formed between the first panel bottom member 400 and the first sound generator 510, between the first panel bottom member 400 and the second sound generator 520, and between the first and second sound generators 510 and 520. The gaps formed between the first panel bottom member 400 and the first sound generator 510, between the first panel bottom member 400 and the second sound generator 520, and between the first and second sound generators 510 and 520 may serve as sound boxes when the first and second sound generators 510 and 520 output the first sound and the second sound, respectively, by vibrating the first and second display panels 110 and 120, respectively.

According to an embodiment, as shown in FIGS. 16 through 18, the first sound can be output by vibrating the first display panel 110 with the first sound generator 510, which is attached to the first display panel 110. In such an embodiment, the second sound may be output by vibrating the second display panel 120 with the second sound generator 520, which is attached to the second display panel 120. Accordingly, the foldable display device 10 may output sound in both folded and unfolded states by vibrating the first display panel 110 with the first sound generator 510 to output the first sound and by vibrating the second display panel 120 with the second sound generator 520 to output the second sound.

Figure 19:
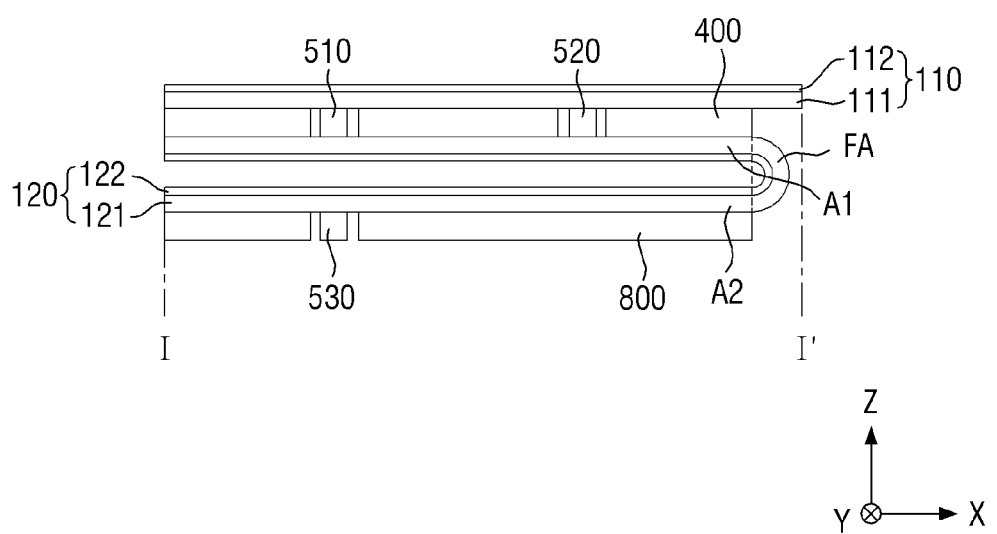
FIGS. 19 and 20 are cross-sectional views illustrating the foldable display device of FIGS. 1 and 2 in folded and unfolded states.
Figure 20:
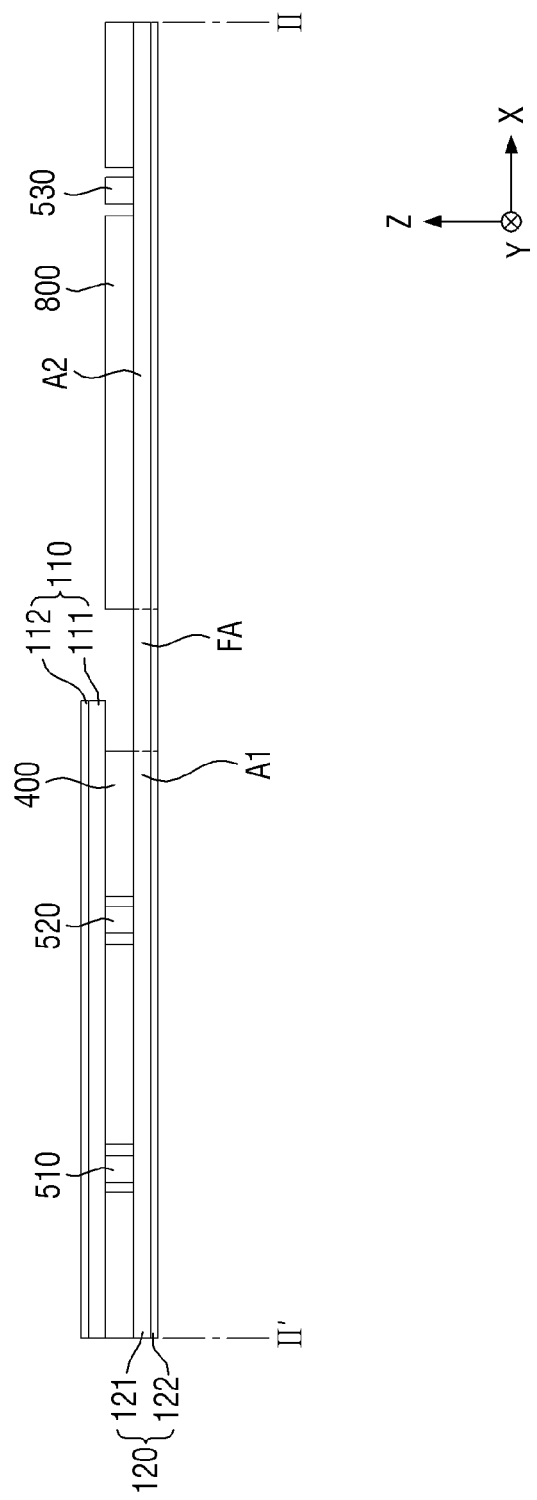

FIGS. 19 and 20 are cross-sectional views illustrating the foldable display device of FIGS. 1 and 2 in folded and unfolded states.

The embodiment of FIGS. 19 and 20 is substantially the same as the embodiment of FIGS. 3 and 4 except that the foldable display device 10 further includes the second sound generator 520 and a third sound generator 530. The same or like elements shown in FIGS. 19 and 20 have been labeled with the same reference characters as used above to describe the embodiment of FIGS. 3 and 4, and any repetitive detailed description thereof will hereinafter be omitted or simplified.

Referring to FIGS. 19 and 20, in an embodiment, the second sound generator 520 may be disposed between the second surfaces of the first and second substrates 111 and 121. The first sound generator 510 may be disposed in the first area A1 of the second display panel 120. The first panel bottom member 400 and the second sound generator 520 may not overlap with each other in the thickness direction of the first display panel 110 (or in the Z-axis direction).

The second sound generator 520 may be attached to the second surfaces of the first and second substrates 111 and 121. In an alternative embodiment where the first light-shielding member 460 is disposed on the second surface of the first substrate 111 and the second light-shielding member 470 is disposed on the second surface of the second substrate 121, as illustrated in FIG. 6, the second sound generator 520 may be attached to the first and second light-shielding members 460 and 470. The length, in the second direction (or the Y-axis direction), of the second sound generator 520 may be substantially the same as the length, in the second direction (or the Y-axis direction), of the first panel bottom member 400.

The third sound generator 530 may be disposed on the second surface of the second substrate 121. The third sound generator 530 may be disposed in the second area A2 of the second display panel 120. The second panel bottom member 800 and the third sound generator 530 may not overlap with each other in the thickness direction of the second display panel 120 (or in the Z-axis direction).

In such an embodiment, the third sound generator 530 may be attached to the second surface of the second substrate 121. In an embodiment where the second light-shielding member 470 is disposed on the second surface of the second substrate 121, as illustrated in FIG. 6, the third sound generator 530 may be attached to the second light-shielding member 470.

The first sound generator 510 may be disposed adjacent to the left side of the first display panel 110, the second sound generator 520 may be disposed adjacent to the right side of the first display panel 110, and the third sound generator 530 may be disposed adjacent to the left side of the first display panel 110 when the second display panel 120 is folded and may be disposed adjacent to the right side of the second display panel 120 when the second display panel 120 is unfolded. The first and third sound generators 510 and 530 may overlap with each other in the thickness direction of the first display panel 110 (or in the Z-axis direction) when the second display panel 120 is folded. The second sound generator 520 may be disposed between the first and third sound generators 510 and 530 in the first direction (or the X-axis direction) when the second display panel 120 is unfolded.

The second and third sound generators 520 and 530 may be piezoelectric elements or actuators including a piezoelectric material that contracts or expands in accordance with driving voltages applied thereto, as illustrated in FIGS. 7 through 10. Alternatively, the second and third sound generators 520 and 530 may be exciters that generate a magnetic force, using a voice coil therein, in accordance with driving voltages applied thereto, as illustrated in FIGS. 11 through 13. Still alternatively, the second and third sound generators 520 and 530 may be vibration motors that generate a magnetic force in a voice coil therein in accordance with driving voltages applied thereto, and the vibration motors may be, for example, LRAs as illustrated in FIG. 14.

In such an embodiment, since the third sound generator 530 is attached only to the second surface of the second substrate 121, the third sound generator 530 may not be attached to the second surface of the first substrate 111. In an alternative embodiment where the first light-shielding member 460 is disposed on the second surface of the first substrate 111, the third sound generator 530 may not be attached to the first light-shielding member 460.

In an embodiment, since the second sound generator 520 is attached to at least one of the first and second display panels 110 and 120, the second sound generator 520 may vibrate the at least one of the first and second display panels 110 and 120 in response to driving voltages applied thereto. Accordingly, the second sound generator 520 may output the second sound using the at least one of the first and second display panels 110 and 120 as a diaphragm. Therefore, the foldable display device 10 may output the second sound in both folded and unfolded states by vibrating the at least one of the first and second display panels 110 and 120 with the second sound generator 520.

In such an embodiment, since the third sound generator 530 is attached to the second display panel 120, the third sound generator 530 may vibrate the second display panel 120 by contracting or expanding in accordance with driving voltages applied thereto. Accordingly, the third sound generator 530 may output third sound by using the second display panel 120 as a diaphragm. Therefore, the foldable display device 10 may output the third sound in both folded and unfolded states by vibrating the second display panel 120 with the third sound generator 530.

A gap may be formed between the first panel bottom member 400 and the second sound generator 520. The gap formed between the first panel bottom member 400 and the second sound generator 520 may serve as a sound box when the second sound generator 520 outputs the second sound by vibrating at least one of the first and second display panels 110 and 120.

A gap may be formed between the second panel bottom member 800 and the third sound generator 530. The gap formed between the second panel bottom member 800 and the third sound generator 530 may serve as a sound box when the third sound generator 530 outputs the third sound by vibrating the second display panel 120.

When the second display panel 120 is folded, the first sound generator 510 may output first stereo sound, the second sound generator 520 may output second stereo sound, and the third sound generator 530 may output low-pitched sound. In one embodiment, for example, the first sound generator 510 may output left stereo sound, the second sound generator 520 may output right stereo sound, and the third sound generator 530 may output low-pitched sound, such that 2.1-channel stereo sound may be realized. When the second display panel 120 is unfolded, the first sound generator 510 may output first stereo sound, the second sound generator 520 may output low-pitched sound, and the third sound generator 530 may output second stereo sound. In one embodiment, for example, the first sound generator 510 may output left stereo sound, the second sound generator 520 may output low-pitched sound, and the third sound generator 530 may output right stereo sound, such that 2.1-channel stereo sound may be realized.

Figure 21:
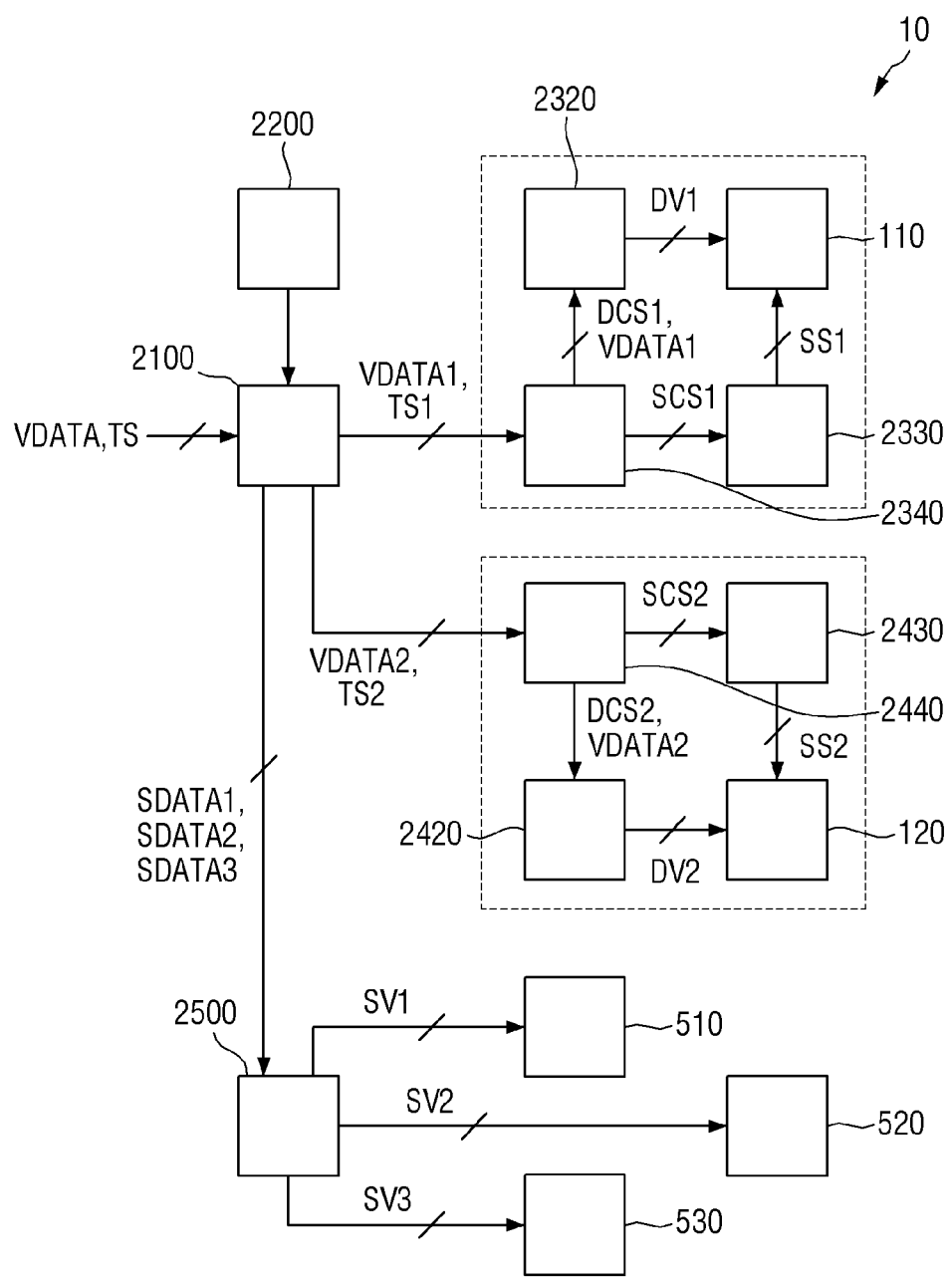
FIG. 21 is a block diagram illustrating the foldable display device of FIGS. 1 and 2.
Figure 22:
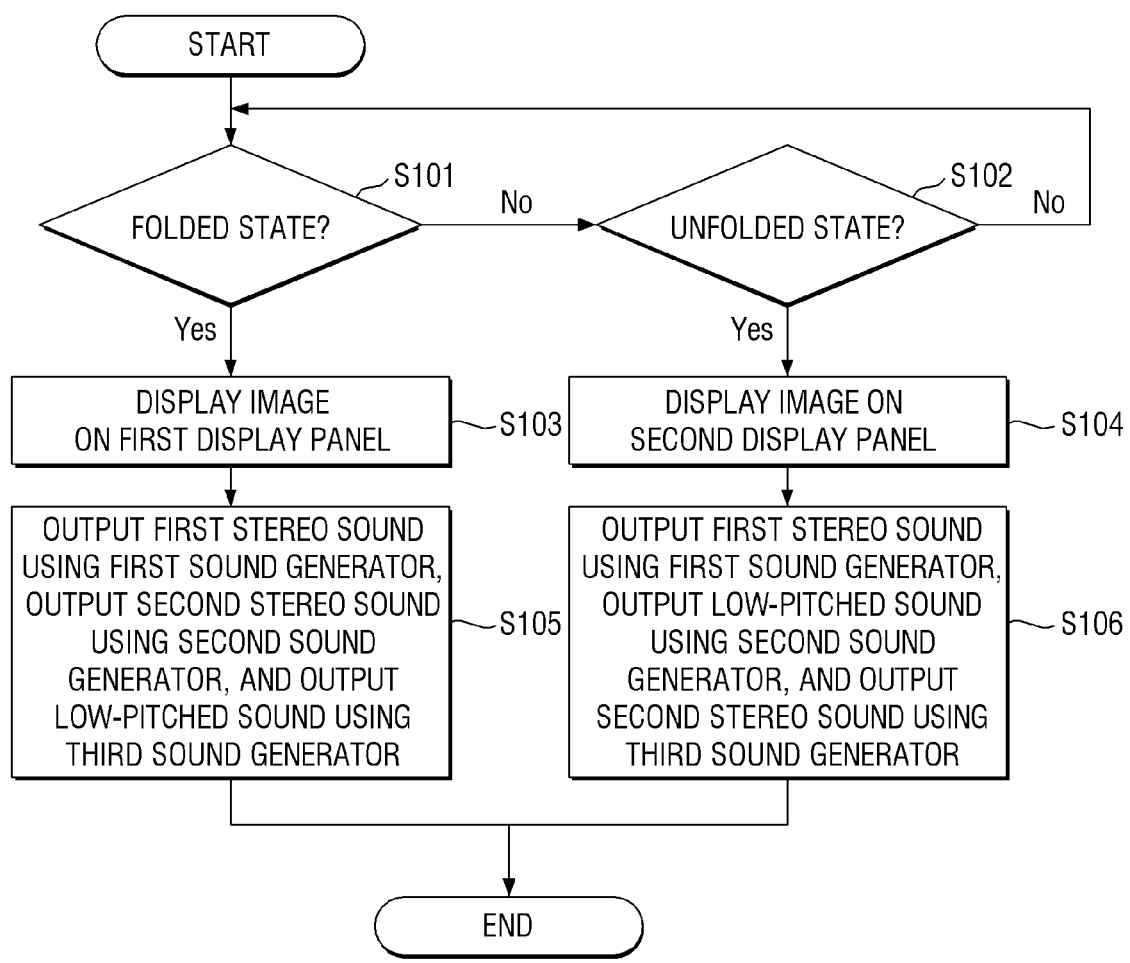
FIG. 22 is a flowchart illustrating a sound providing method of a foldable display device according to an embodiment of the disclosure.

FIG. 21 is a block diagram illustrating the foldable display device of FIGS. 1 and 2. FIG. 22 is a flowchart illustrating a sound providing method of a foldable display device according to an embodiment of the disclosure.

Referring to FIGS. 21 and 22, an embodiment of the foldable display device 10 may include the first display panel 110, a first data driver 2320, a first scan driver 2330, a first timing controller 2340, the second display panel 120, a second data driver 2420, a second scan driver 2430, a second timing controller 2440, the first sound generator 510, the second sound generator 520, the third sound generator 530, a processor 2100, a folding sensor 2200, and a sound driver 2500.

The first display panel 110 includes the first display area DA1 in which a plurality of pixels are disposed to display an image. The first display panel 110 may include data lines, scan lines which intersect the data lines, and a plurality of pixels which are connected to the data lines and the scan lines. Each of the plurality of pixels of the first display panel 110 may include subpixels PX1, PX2, and PX3, as illustrated in FIG. 5. Each of the subpixels PX1, PX2, and PX3 may be connected to at least one of the data lines of the first display panel 110 and at least one of the scan lines of the first display panel 110. Each of the subpixels PX1, PX2, and PX3 may include an organic light-emitting element and a plurality of transistors and at least one capacitor for supplying a current to the organic light-emitting element. The organic light-emitting element may be an OLED including a first electrode, an organic light-emitting layer, and a second electrode.

The first data driver 2320 receives first digital video data VDATA1 and a first source control signal DCS1 from the first timing controller 2340. The first data driver 2320 converts the first digital video data VDATA1 into first analog data voltages DV1 in accordance with the first source control signal DCS1 and may provide the first analog data voltages DV1 to the data lines of the first display panel 110.

The first scan driver 2330 receives a first scan control signal SCS1 from the first timing controller 2340. The first scan driver 2330 generates scan signals SS1 in accordance with the first scan control signal SCS1 and provides the scan signals SS1 to the scan lines of the first display panel 110. The first scan driver 2330 may include a plurality of transistors and may be disposed in the non-display area of the first display panel 110. Alternatively, the first scan driver 2330 may be formed as an integrated circuit ("IC"), and the first scan driver 2330 may be mounted on a gate flexible film attached to the first substrate 111 of the first display panel 110.

The first timing controller 2340 receives the first digital video data VDATA1 and first timing signals TS1 from the processor 2100. The first timing signals TS1 may include a vertical synchronization signal, a horizontal synchronization signal, a data enable signal, and a dot clock.

The first timing controller 2340 generates timing control signals for controlling the timings of the operations of the first data driver 2320 and the first scan driver 2330. The timing control signals may include a first source control signal DCS1 for controlling the timing of the operation of the first data driver 2320 and a first scan control signal SCS1 for controlling the timing of the operation of the first scan driver 2330.

The second display panel 120 includes the second display area DA2 in which a plurality of pixels are disposed to display an image. The second display panel 120 may include data lines, scan lines which intersect the data lines, and a plurality of pixels which are connected to the data lines and the scan lines. Each of the plurality of pixels of the second display panel 120 may include subpixels PX1, PX2, and PX3, as illustrated in FIG. 5. Each of the subpixels PX1, PX2, and PX3 may be connected to at least one of the data lines of the second display panel 120 and at least one of the scan lines of the second display panel 120. Each of the subpixels PX1, PX2, and PX3 may include an organic light-emitting element and a plurality of transistors and at least one capacitor for supplying a current to the organic light-emitting element. The organic light-emitting element may be an OLED including a first electrode, an organic light-emitting layer, and a second electrode.

The second data driver 2420 receives second digital video data VDATA2 and a second source control signal DCS2 from the second timing controller 2440. The second data driver 2420 converts the second digital video data VDATA2 into second analog data voltages DV2 in accordance with the second source control signal DCS2 and may provide the second analog data voltages DV2 to the data lines of the second display panel 120.

The second scan driver 2430 receives a second scan control signal SCS2 from the second timing controller 2440. The second scan driver 2430 generates scan signals SS2 in accordance with the second scan control signal SCS2 and provides the scan signals SS2 to the scan lines of the second display panel 120. The second scan driver 2430 may include a plurality of transistors and may be disposed in the non-display area of the second display panel 120. Alternatively, the second scan driver 2430 may be formed as an IC, and the second scan driver 2430 may be mounted on a gate flexible film attached to the second substrate 121 of the second display panel 120.

The second timing controller 2440 receives the second digital video data VDATA2 and second timing signals TS2 from the processor 2100. The second timing signals TS2 may include a vertical synchronization signal, a horizontal synchronization signal, a data enable signal, and a dot clock.

The second timing controller 2440 generates timing control signals for controlling the timings of the operations of the second data driver 2420 and the second scan driver 2430. The timing control signals may include a second source control signal DCS2 for controlling the timing of the operation of the second data driver 2420 and a second scan control signal SCS2 for controlling the timing of the operation of the second scan driver 2430.

In an embodiment, the first, second, and third sound generators 510, 520, and 530 may be piezoelectric elements or actuators including a piezoelectric material that contracts or expands in accordance with driving voltages applied thereto, as illustrated in FIGS. 7 through 10. Alternatively, the first, second, and third sound generators 510, 520, and 530 may be exciters that generate a magnetic force, using a voice coil therein, in accordance with driving voltages applied thereto, as illustrated in FIGS. 11 through 13. Still alternatively, the first, second, and third sound generators 510, 520, and 530 may be vibration motors that generate a magnetic force in a voice coil therein in accordance with driving voltages applied thereto, and the vibration motors may be, for example, LRAs as illustrated in FIG. 14.

The first sound generator 510 receives a first sound signal SV1 from the sound driver 2500. The first sound generator 510 may output the first sound by vibrating at least one of the first and second display panels 110 and 120 in accordance with the first sound signal SV1.

The second sound generator 520 receives a second sound signal SV2 from the sound driver 2500. The second sound generator 520 may output the second sound by vibrating at least one of the first and second display panels 110 and 120 in accordance with the second sound signal SV2.

The third sound generator 530 receives a third sound signal SV3 from the sound driver 2500. The third sound generator 530 may output the third sound by vibrating the second display panel 120 in accordance with the third sound signal SV3.

Each of the first, second, and third sound signals SV1, SV2, and SV3 may include first and second driving voltages.

The sound driver 2500 receives first sound data SDATA1, second sound data SDATA2, and third sound data SDATA3 from the processor 2100. The sound driver 2500 may generate the first sound signal SV1, which is an analog signal to be output by the first sound generator 510, in accordance with the first sound data SDATA1. The sound driver 2500 may generate the second sound signal SV2, which is an analog signal to be output by the second sound generator 520, in accordance with the second sound data SDATA2. The sound driver 2500 may generate the third sound signal SV3, which is an analog signal to be output by the third sound generator 530, in accordance with the third sound data SDATA3.

The sound driver 2500 may include a digital signal processor ("DSP") which processes, with an algorithm, and thereby modifies or improves the first sound data SDATA1, the second sound data SDATA2, and the third sound data SDATA3 that are digital signals, a digital-to-analog converter ("DAC") which converts the first sound data SDATA1, the second sound data SDATA2, and the third sound data SDATA3 that are processed by the DSP into the first, second, and third sound signals SV1, SV2, and SV3, respectively, that are analog signals, and an amplifier ("AMP") which amplifies and outputs the analog signals provided by the DAC.

In an embodiment, the processor 2100 may include a scaler that converts digital video data VDATA, which is input from the outside, to conform to the resolution of the first and second display panels 110 and 120. In an embodiment, the processor 2100 may include a converter that converts the digital video data VDATA to improve the quality of an image. The processor 2100 outputs the first digital video data VDATA1 and the first timing signals TS1 to the first timing controller 2340 based on the digital video data VDATA and timing signal TS. The processor 2100 outputs the second digital video data VDATA2 and the second timing signals TS2 to the second timing controller 2440 based on the digital video data VDATA and timing signal TS.

The processor 2100 may determine whether the folding area FA of the second display panel 120 is in a folded state based on a folding sensing signal FSS from the folding sensor 2200. In one embodiment, for example, in response to a folding sensing signal FSS having a first logic-level voltage being received, the processor 2100 may determine that the folding area FA of the second display panel 120 is in a folded state, and in response to a folding sensing signal FSS having a second logic-level voltage being received, the processor 2100 may determine that the folding area FA of the second display panel 120 is in an unfolded state.

Referring to FIG. 22, in S101 and S102, when the folding area FA of the second display panel 120 is folded, the processor 2100 may output the first digital video data DATA1 and the first timing signals TS1 to the first timing controller 2340, such that the first image may be displayed in the first display area DA1 of the first display panel 110.

In S104 and S105, when the folding area FA of the second display panel 120 is unfolded, the processor 2100 may output the second digital video data DATA2 and the second timing signals TS2 to the second timing controller 2440, such that the second image may be displayed in the second display area DA2 of the second display panel 120.

The processor 2100 may output the first sound data SDATA1, the second sound data SDATA2, and the third sound data SDATA3 in accordance with the folding sensing signal FSS from the folding sensor 2200.

In S103, when the folding area FA of the second display panel 120 is folded, the processor 2100 may output the first sound data SDATA1, the second sound data SDATA2, and the third sound data SDATA3 such that the first, second, and third sound generators 510, 520, and 530 may output first stereo sound, second stereo sound, and low-pitched sound, respectively.

In S106, when the folding area FA of the second display panel 120 is unfolded, the processor 2100 may output the first sound data SDATA1, the second sound data SDATA2, and the third sound data SDATA3 such that the first, second, and third sound generators 510, 520, and 530 may output first stereo sound, low-pitched sound, and second stereo sound, respectively.

The folding sensor 2200 may determine whether the folding area FA of the second display panel 120 is in a folded state or in an unfolded state. In one embodiment, for example, the folding sensor 2200 may determine whether the folding area FA of the second display panel 120 is in a folded state or in an unfolded state based on a variation in the voltage applied to a folding line provided in the folding area FA. In a case where it is determined that the folding area FA of the second display panel 120 is in a folded state, the folding sensor 2200 may output the folding sensing signal FSS having the first logic-level voltage. In a case where it is determined that the folding area FA of the second display panel 120 is an unfolded state, the folding sensor 2200 may output the folding sensing signal FSS having the second logic-level voltage. The first logic-level voltage may be a low level voltage such as a voltage of 0 volt (V), and the second logic-level voltage may be a high level voltage such as a voltage of 3.3 V.

Figure 23:
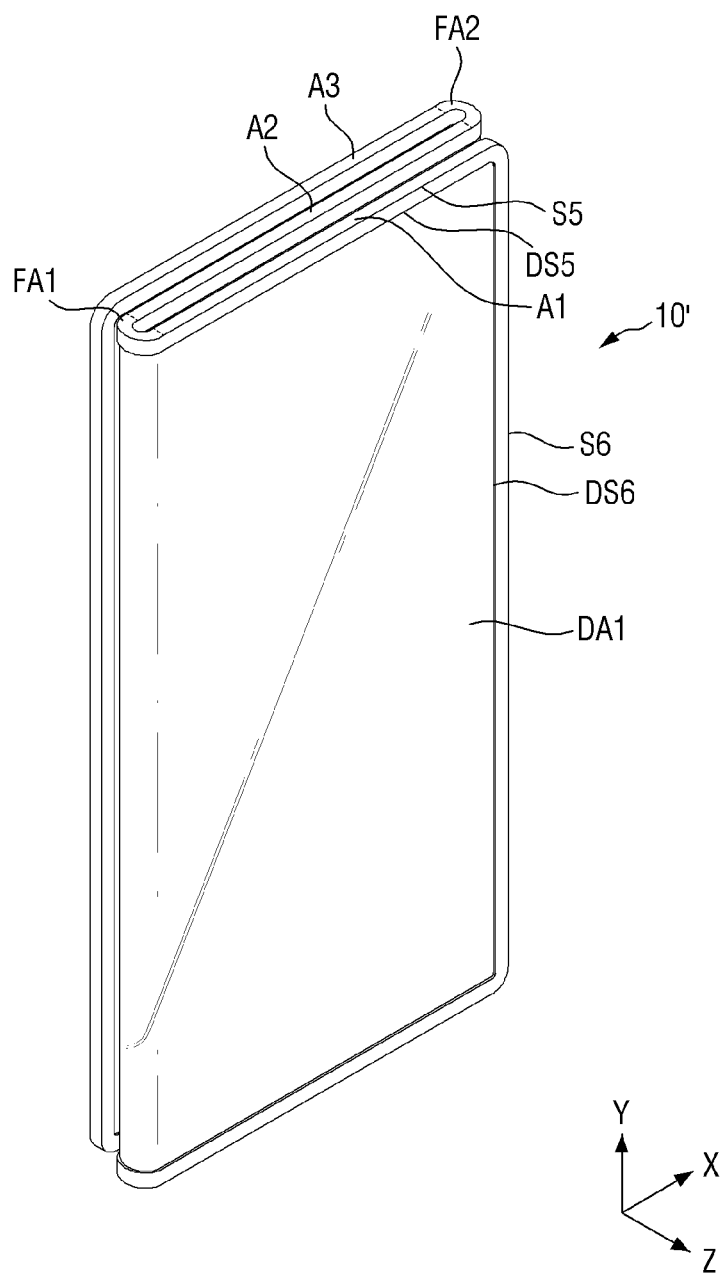
FIGS. 23 and 24 are perspective views illustrating a foldable display device according to an alternative embodiment of the disclosure in folded and unfolded states.
Figure 24:
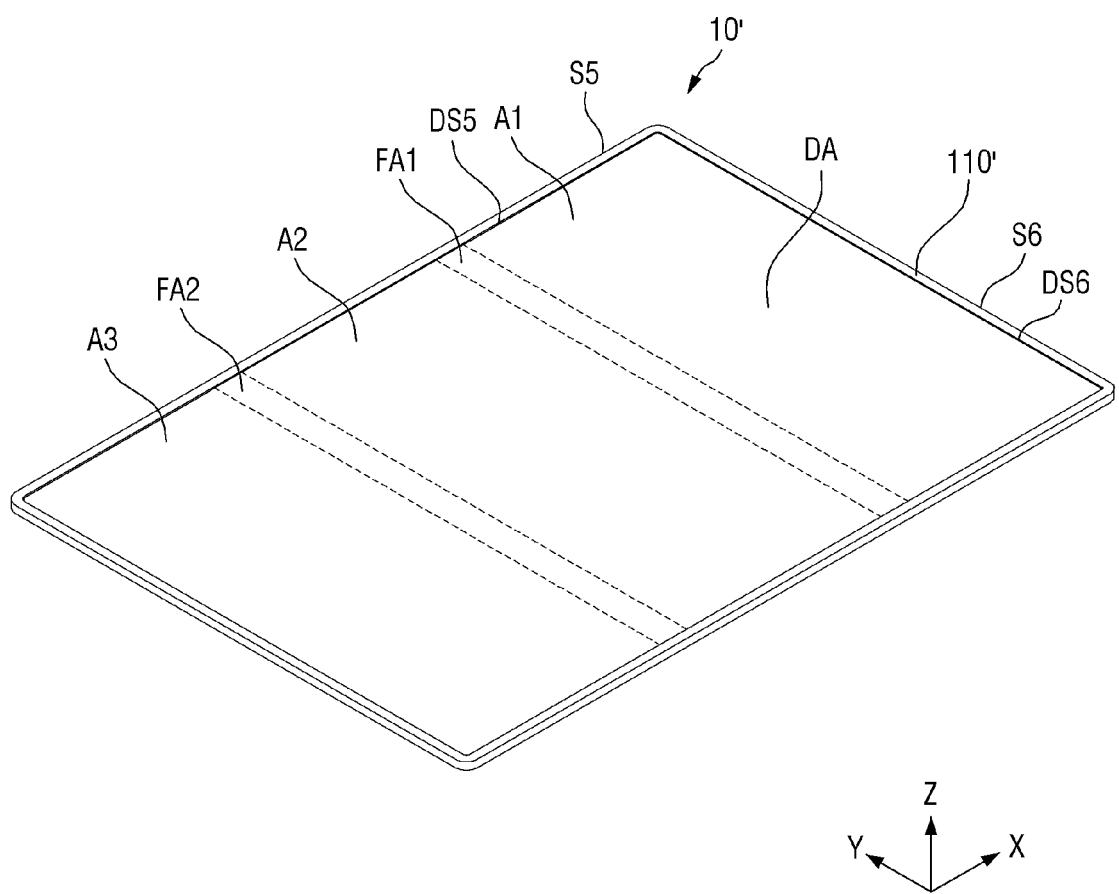

FIGS. 23 and 24 are perspective views illustrating a foldable display device according to an alternative embodiment of the disclosure in folded and unfolded states.

Referring to FIGS. 23 and 24, an embodiment of a foldable display device 10' includes a display panel 110' having a display area DA.

The display panel 110' may include first and second folding areas FA1 and FA2 and may be folded, as illustrated in FIG. 23, or unfolded, as illustrated in FIG. 24. When unfolded, the display panel 110' may have a rectangular shape in a plan view. For example, in a plan view, the display panel 110' may have a rectangular shape having fifth sides S5 extending in the first direction (or the X-axis direction) and sixth sides S6 extending in the second direction (or the Y-axis direction). The fifth sides S5 may be shorter than the sixth sides S6, in which case, a user can view a screen in a portrait position that is longer in the second direction (or the Y-axis direction) than in the first direction (or the X-axis direction). Alternatively, the fifth sides S5 may be longer than the sixth sides S6, in which case, the user can view a screen in a landscape position that is longer in the first direction (or the X-axis direction) than in the second direction (or the Y-axis direction). Still alternatively, the fifth sides S5 may have substantially the same length as the sixth sides S6, in which case, the user may view a square screen. The corners where the fifth sides S5 and the sixth sides S6 meet may be rounded with a predetermined curvature or may be right-angled. The planar shape of the display panel 110' is not particularly limited, and the display panel 110' may be variously modified to be in one of various other shapes such as a polygonal shape, a circular shape, or an elliptical shape, for example.

When unfolded, the display area DA of the display panel 110' may have a rectangular shape having fifth display sides DS5 extending in the first direction (or the X-axis direction) and sixth display sides DS6 extending in the second direction (or the Y-axis direction) in a plan view. The fifth display sides DS5 may be shorter than the sixth display sides DS6. Alternatively, the fifth display sides DS5 may be longer than the sixth display sides DS6. Still alternatively, the fifth display sides DS5 may have substantially the same length as the sixth display sides DS6. The corners where the fifth display sides DS5 and the sixth display sides DS6 meet may be rounded with a predetermined curvature or may be right-angled. The planar shape of the display area DA is not particularly limited, and the display area DA may be variously modified to be in one of various other shapes such as a polygonal shape, a circular shape, or an elliptical shape, for example.

The display panel 110' may include a first area A1, a second area A2, a third area A3, a first folding area FA1 between the first and second areas A1 and A2, and a second folding area FA2 between the second and third areas A2 and A3. The display panel 110' may be a flexible substrate that is bendable, foldable, or rollable and may thus be easily folded in the first and second folding areas FA1 and FA2. In an embodiment, hinges may be disposed in the first and second folding areas FA1 and FA2 on a second surface of the display panel 110' to effectively fold the display panel 110'.

When the display panel 110' is folded, the first folding area FA1 may be out-folded such that part of the display area DA in the first area A1 and part of the display area DA in the second area A2 can face opposite directions, and the second folding area FA2 may be in-folded in the second folding area FA2 such that part of the display area DA in the second area A2 and part of the display area DA in the third area A3 can face each other. When the display panel 110' is folded, the display area DA may be curved in the first and second folding areas FA1 and FA2 to have a predetermined curvature.

According to an embodiment, as shown in FIGS. 23 and 24, when the display panel 110' is folded, a first image may be displayed in part of the display area DA in the first area A1. In such an embodiment, when the display panel 110' is unfolded, a second image can be displayed in parts of the display area DA in the first, second, and third areas A1, A2, A3 and in the first and second folding areas FA1 and F2.

Figure 25:
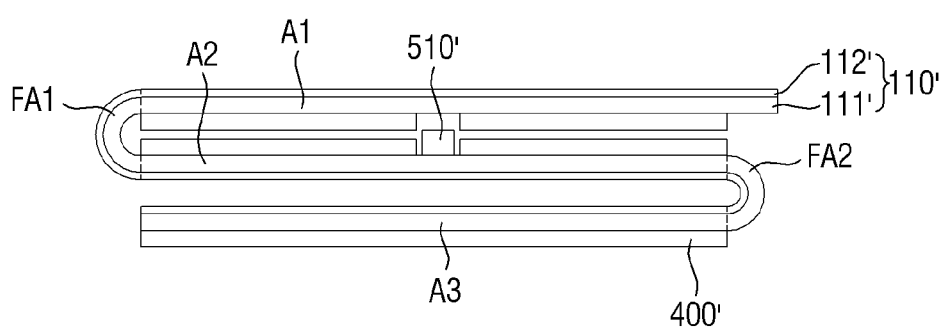
FIGS. 25 and 26 are cross-sectional views illustrating the foldable display device of FIGS. 23 and 24 in folded and unfolded states.
Figure 26:
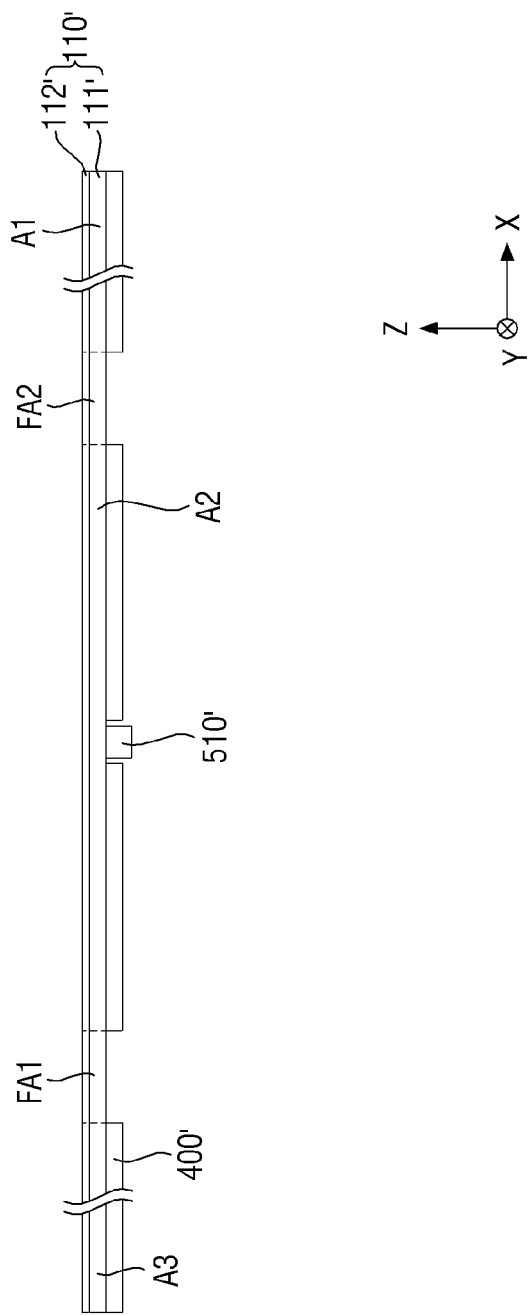

FIGS. 25 and 26 are cross-sectional views illustrating the foldable display device of FIGS. 23 and 24 in folded and unfolded states.

Referring to FIGS. 25 and 26, the foldable display device 10' may include the display panel 110', a panel bottom member 400', and a first sound generator 510'.

A substrate 111' and a pixel array layer 112' of the display panel 110' are substantially the same as the first substrate 111 and the first pixel array layer 112, respectively, of FIGS. 3 and 4, and thus, any repetitive detailed descriptions thereof will be omitted.

The panel bottom member 400' may be attached to a second surface of the substrate 111'. The panel bottom member 400' may be disposed in the first, second, and third areas A1, A2, and A3 of the display panel 110'. The panel bottom member 400' may not be disposed in the first and second folding areas FA1 and FA2 of the display panel 110' to reduce folding stress.

The panel bottom member 400' is substantially the same as the first panel bottom member 400 of FIG. 5, except that the second adhesive 420 and the second buffer member 440 are omitted. That is, the panel bottom member 400' is substantially the same as the first panel bottom member 400 of FIG. 6, including the first adhesive 410, the first buffer member 430, and the first heat-dissipating member 450, and thus, any repetitive detailed description thereof will be omitted.

The first sound generator 510' may be attached to the second surface of the substrate 111. Alternatively, a first light-shielding member 460 is disposed on the second surface of the substrate 111, as illustrated in FIG. 6, and the first sound generator 510' may be attached to the first light-shielding member 460.

The first sound generator 510' may be a piezoelectric element or actuator including a piezoelectric material that contracts or expands in accordance with driving voltages applied thereto, as illustrated in FIGS. 7 through 10. Alternatively, the first sound generator 510' may be an exciter that generate a magnetic force, using a voice coil therein, in accordance with driving voltages applied thereto, as illustrated in FIGS. 11 through 13. Still alternatively, the first sound generator 510' may be a vibration motor that generate a magnetic force in a voice coil therein in accordance with driving voltages applied thereto, and the vibration motor may be, for example, an LRA as illustrated in FIG. 14.

In such an embodiment, since the first sound generator 510' is attached to the display panel 110', the first sound generator 510' may vibrate the display panel 110' by contracting or expanding in accordance with driving voltages applied thereto. Accordingly, the first sound generator 510' may output first sound by using the display panel 110' as a diaphragm. Therefore, the foldable display device 10' may output the first sound in both folded and unfolded states by vibrating the display panel 110' with the first sound generator 510'.

In an embodiment, as illustrated in FIGS. 25 and 26, the first sound generator 510' may be disposed in the first area A1 of the display panel 110', but the location of the first sound generator 510' is not particularly limited. Alternatively, the first sound generator 510' may be disposed in the second and third areas A2 and A3.

FIGS. 25 and 26 illustrate an embodiment where only a single sound generator is provided, but the number of the sound generators provided is not particularly limited. Alternatively, the foldable display device 10' may further include second and third sound generators. In such an embodiment, the first sound generator 510' may be disposed in the first area A1 of the display panel 110', the second sound generator may be disposed in the second area A2 of the display panel 110', and the third sound generator may be disposed in the third area A3 of the display panel 110'. In such an embodiment, when the display panel 110' is folded, the first sound generator 510' may output the first sound, and at least one of the second and third sound generators may output low-pitched sound. In such an embodiment, when the display panel 110' is unfolded, the first sound generator 510' may output first stereo sound, the second sound generator may output low-pitched sound, and the third sound generator may output second stereo sound. Accordingly, the foldable display device 10' may provide 2.1-channel stereo sound in an unfolded state.

Figure 27:
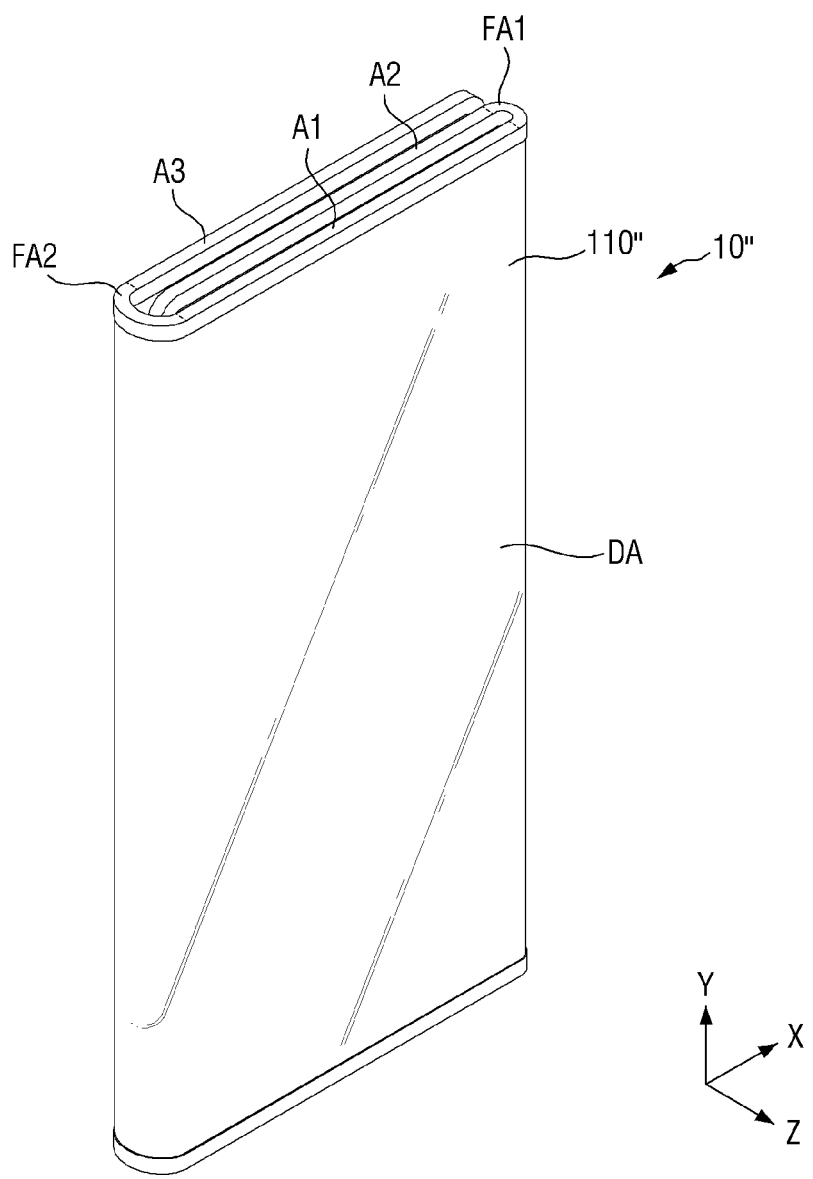
FIGS. 27 and 28 are perspective views illustrating a foldable display device according to another alternative embodiment of the disclosure in folded and unfolded states.
Figure 28:
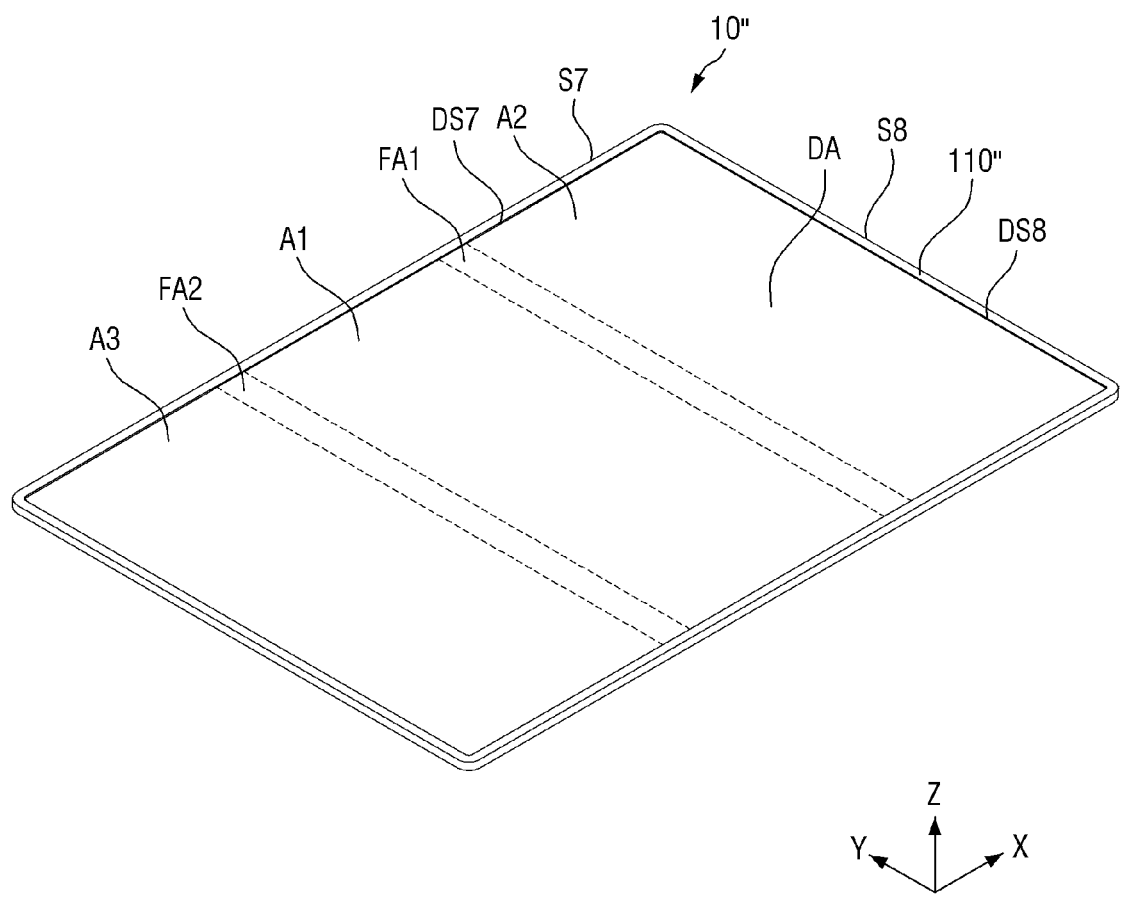

FIGS. 27 and 28 are perspective views illustrating a foldable display device according to another alternative embodiment of the disclosure in folded and unfolded states.

Referring to FIGS. 27 and 28, an embodiment of a foldable display device 10" includes a display panel 110" having a display area DA.

The display panel 110" may include first and second folding areas FA1 and FA2 and may be folded, as illustrated in FIG. 27, or unfolded, as illustrated in FIG. 28. When unfolded, the display panel 110" may have a rectangular shape in a plan view. In one embodiment, for example, in a plan view, the display panel 110" may have a rectangular shape having seventh sides S7 extending in the first direction (or the X-axis direction) and eighth sides S8 extending in the second direction (or the Y-axis direction). The seventh sides S7 may be shorter than the eighth sides S8, such that a user can view a screen in a portrait position that is longer in the second direction (or the Y-axis direction) than in the first direction (or the X-axis direction). Alternatively, the seventh sides S7 may be longer than the eighth sides S8, in which case, the user can view a screen in a landscape position that is longer in the first direction (or the X-axis direction) than in the second direction (or the Y-axis direction). Still alternatively, the seventh sides S7 may have substantially the same length as the eighth sides S8, in which case, the user can view a square screen. The corners where the seventh sides S7 and the eighth sides S8 meet may be rounded with a predetermined curvature or may be right-angled. The planar shape of the display panel 110" is not particularly limited, and the display panel 110" may be modified to be in one of various other shapes such as a polygonal shape, a circular shape, or an elliptical shape, for example.

When unfolded, the display area DA of the display panel 110" may have a rectangular shape having seventh display sides DS7 extending in the first direction (or the X-axis direction) and eighth display sides DS8 extending in the second direction (or the Y-axis direction) in a plan view. The seventh display sides DS7 may be shorter than the eighth display sides DS8. Alternatively, the seventh display sides DS7 may be longer than the eighth display sides DS8. Still alternatively, the seventh display sides DS7 may have substantially the same length as the eighth display sides DS8. The corners where the seventh display sides DS7 and the eighth display sides DS8 meet may be rounded with a predetermined curvature or may be right-angled. The planar shape of the display area DA is not particularly limited, and the display area DA may be variously modified to be in one of other shapes such as a polygonal shape, a circular shape, or an elliptical shape, for example.

The display panel 110" may include a first area A1, a second area A2, a third area A3, a first folding area FA1 between the first and second areas A1 and A2, and a second folding area FA2 between the first and third areas A1 and A3. When the display panel 110" is folded, the first folding area FA1 may be out-folded such that part of the display area DA in the first area A1 and part of the display area DA in the second area A2 may face opposite directions, and the second folding area FA2 may be out-folded such that part of the display area DA in the first area A1 and part of the display area DA in the third area A3 may face opposite directions. When the display panel 110" is folded, the display area DA may be curved in the first and second folding areas FA1 and FA2 to have a predetermined curvature. The curvature of the display area DA may be greater in the first folding area FA1 than in the second folding area FA2.

According to an embodiment, as shown in FIGS. 27 and 28, when the display panel 110" is folded, a first image may be displayed in part of the display area DA in the first area A1. In such an embodiment, when the display panel 110" is unfolded, a second image may be displayed in parts of the display area DA in the first, second, and third areas A1, A2, A3 and in the first and second folding areas FA1 and F2.

Figure 29:
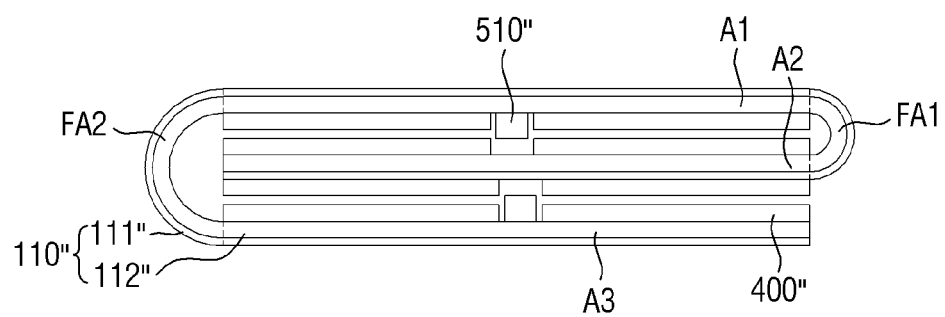
FIGS. 29 and 30 are cross-sectional views illustrating the foldable display device of FIGS. 27 and 28 in folded and unfolded states.
Figure 30:
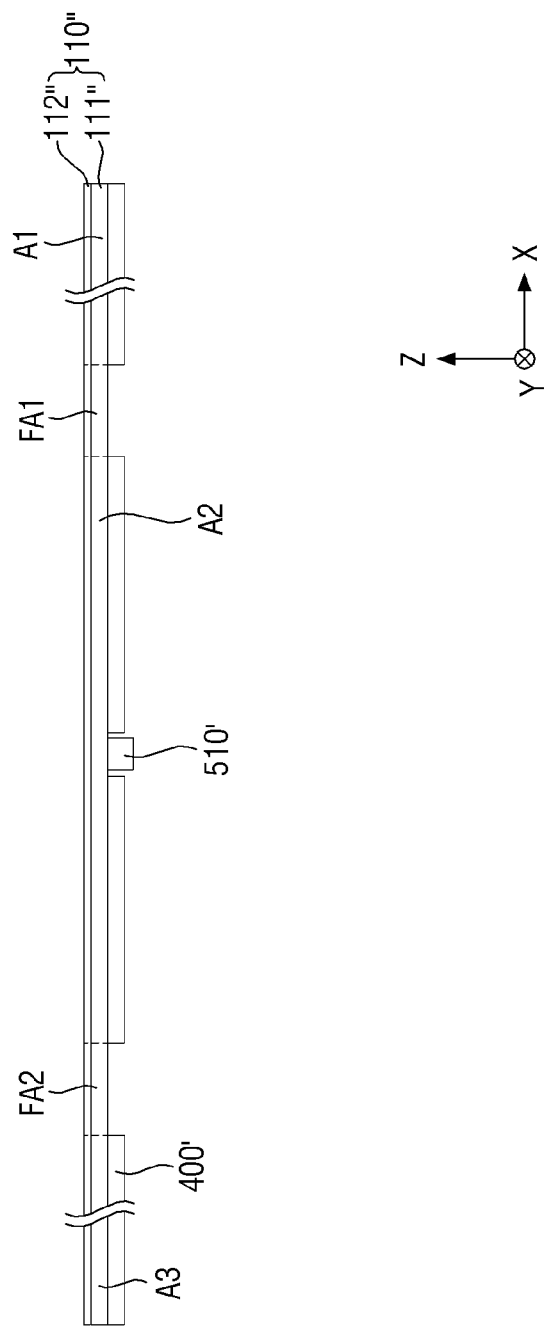

FIGS. 29 and 30 are cross-sectional views illustrating the foldable display device of FIGS. 27 and 28 in folded and unfolded states.

Referring to FIGS. 29 and 30, the foldable display device 10" may include the display panel 110", a panel bottom member 400", and a first sound generator 510".

A substrate 111" and a pixel array layer 112" of the display panel 110" are substantially the same as the first substrate 111 and the first pixel array layer 112, respectively, of FIGS. 3 and 4, and thus, any repetitive detailed descriptions thereof will be omitted.

The panel bottom member 400" may be attached to a second surface of the substrate 111". The panel bottom member 400" may be disposed in the first, second, and third areas A1, A2, and A3 of the display panel 110". The panel bottom member 400" may not be disposed in the first and second folding areas FA1 and FA2 of the display panel 110" to reduce folding stress.

The panel bottom member 400" is substantially the same as the first panel bottom member 400 of FIG. 5, excluding the second adhesive 420 and the second buffer member 440. That is, the panel bottom member 400" is substantially the same as the first panel bottom member 400 of FIG. 6, including the first adhesive 410, the first buffer member 430, and the first heat-dissipating member 450, and thus, any repetitive detailed description thereof will be omitted.

The first sound generator 510" may be attached to the second surface of the substrate 111. Alternatively, in a case where a first light-shielding member 460 is disposed on the second surface of the substrate 111, as illustrated in FIG. 6, the first sound generator 510" may be attached to the first light-shielding member 460.

The first sound generator 510" may be a piezoelectric element or actuator including a piezoelectric material that contracts or expands in accordance with driving voltages applied thereto, as illustrated in FIGS. 7 through 10. Alternatively, the first sound generator 510" may be an exciter that generates a magnetic force, using a voice coil therein, in accordance with driving voltages applied thereto, as illustrated in FIGS. 11 through 13. Still alternatively, the first sound generator 510" may be a vibration motor that generates a magnetic force in a voice coil therein in accordance with driving voltages applied thereto, and the vibration motor may be, for example, an LRA as illustrated in FIG. 14.

In such an embodiment, since the first sound generator 510" is attached to the display panel 110", the first sound generator 510" may vibrate the display panel 110" by contracting or expanding in accordance with driving voltages applied thereto. Accordingly, the first sound generator 510" may output first sound by using the display panel 110" as a diaphragm. Therefore, the foldable display device 10" may output the first sound in both folded and unfolded states by vibrating the display panel 110" with the first sound generator 510".

The first sound generator 510" is illustrated in FIGS. 29 and 30 as being disposed in the first area A1 of the display panel 110", but the location of the first sound generator 510" is not particularly limited. Alternatively, the first sound generator 510" may be disposed in the second and third areas A2 and A3.

FIGS. 29 and 30 illustrate an embodiment where only a single sound generator is provided, but the number of the sound generators provided is not particularly limited. In an alternative embodiment, the foldable display device 10" may further include second and third sound generators. In such an embodiment, the first sound generator 510" may be disposed in the first area A1 of the display panel 110", the second sound generator may be disposed in the second area A2 of the display panel 110", and the third sound generator may be disposed in the third area A3 of the display panel 110". In such an embodiment, when the display panel 110" is folded, the first sound generator 510" may output the first sound, and at least one of the second and third sound generators may output low-pitched sound. In such an embodiment, when the display panel 110" is unfolded, the first sound generator 510" may output low-pitched sound, the second sound generator may output first stereo sound, and the third sound generator may output second stereo sound. Accordingly, the foldable display device 10" may provide 2.1-channel stereo sound in an unfolded state.

The invention should not be construed as being limited to the embodiments set forth herein. Rather, these embodiments are provided so that this disclosure will be thorough and complete and will fully convey the concept of the invention to those skilled in the art.

While the inventions have been particularly shown and described with reference to some embodiments thereof, it will be understood by one of ordinary skill in the art that various changes in form and detail may be made therein without departing from the spirit and scope of the invention as defined by the following claims.

What is claimed is:

1. A foldable display device comprising:
    a first display panel including a first substrate and a first pixel array layer which is disposed on a first surface of the first substrate;
    a second display panel including a second substrate and a second pixel array layer which is disposed on a first surface of the second substrate; and
    a first sound generator between a second surface of the first display panel opposite to the first surface of the first substrate and a second surface of the second substrate opposite to the first surface of the second substrate,
    wherein the first sound generator outputs first sound by vibrating at least one of the first and second display panels, and
    wherein the second display panel includes a first area, a second area, and a folding area between the first and second areas.

2. The foldable display device of claim 1, wherein the first sound generator is attached to the second surface of the first substrate and the second surface of the second substrate.

3. The foldable display device of claim 1, further comprising:
    a first light-shielding member disposed between the first sound generator and the second surface of the first substrate; and
    a second light-shielding member disposed between the first sound generator and the second surface of the second substrate.

4. The foldable display device of claim 1, further comprising:
    a first reinforcing member disposed on a first side of the first sound generator and between the first sound generator and the second surface of the first substrate; and
    a second reinforcing member disposed on a second side of the first sound generator and between the first sound generator and the second surface of the second substrate.

5. The foldable display device of claim 1, wherein
    the second pixel array layer in the first area and the second pixel array layer in the second area face each other.

6. The foldable display device of claim 5, wherein the first sound generator is disposed in the first area of the second display panel.

7. The foldable display device of claim 6, further comprising:
    a first panel bottom member disposed between the second surfaces of the first and second substrates in the first area of the second display panel and not overlapping with the first sound generator when viewed in a plan view in a thickness direction of the first display panel.

8. The foldable display device of claim 7, wherein the first panel bottom member includes:
    a first adhesive disposed on the second surface of the first substrate;
    a second adhesive disposed on the second surface of the second substrate; and
    a first heat-dissipating member disposed between the first and second adhesives.

9. The foldable display device of claim 8, wherein the first panel bottom member further includes:
    a first buffer member disposed between the first adhesive and the first heat-dissipating member; and
    a second buffer member disposed between the second adhesive and the first heat-dissipating member.

10. The foldable display device of claim 7, further comprising:
    a second panel bottom member disposed on the second surface of the second substrate in the second area of the second display panel.

11. The foldable display device of claim 10, wherein a thickness of the first panel bottom member is greater than a thickness of the second panel bottom member.

12. The foldable display device of claim 10, wherein the first and second panel bottom members are not disposed in the folding area.

13. The foldable display device of claim 10, wherein the second panel bottom member includes:
- a third adhesive disposed on the second surface of the second substrate in the second area of the second display panel;
- a second heat-dissipating member disposed on the third adhesive; and
- a third buffer member disposed between the third adhesive and the second heat-dissipating member.

14. The foldable display device of claim 6, further comprising:
- a second sound generator disposed between the second surfaces of the first and second substrates in the first area of the second display panel,
- wherein the second sound generator outputs second sound by vibrating at least one of the first and second display panels.

15. The foldable display device of claim 14, wherein
the first sound generator is attached to the second surface of the first substrate, and
the second sound generator is attached to the second surface of the second display panel.

16. The foldable display device of claim 15, wherein the first and second sound generators do not overlap with each other when viewed from a plan view in a thickness direction of the first display panel.

17. The foldable display device of claim 14, further comprising:
- a third sound generator disposed on the second surface of the second substrate in the second area of the second display panel,
- wherein the third sound generator outputs third sound by vibrating the second display panel.

18. The foldable display device of claim 17, wherein the first sound generator vibrates the at least one of the first and second display panels by using a piezoelectric material which contracts or expands in accordance with voltages applied thereto.

19. The foldable display device of claim 17, wherein the second and third sound generators vibrate at least one of the first and second display panels or only the second display panel by generating a magnetic force using a voice coil therein.

20. A sound providing method of a foldable display device, the method comprising:
- when a folding area of a second display panel of the foldable display device is folded, displaying a first image using pixels of a first pixel array layer of a first display panel of the foldable display device and outputting first sound by vibrating the first display panel with a first sound generator; and
- when the folding area of the second display panel is unfolded, displaying a second image using pixels of a second pixel array layer of the second display panel and outputting second sound by vibrating the second display panel with the first sound generator.

* * * * *